US011119852B2

United States Patent
Yang et al.

(10) Patent No.: US 11,119,852 B2
(45) Date of Patent: Sep. 14, 2021

(54) MEMORY DEVICE HAVING ERROR CORRECTION FUNCTION AND ERROR CORRECTION METHOD FOR MEMORY DEVICE

(71) Applicant: Research & Business Foundation Sungkyunwan University, Suwon-si (KR)

(72) Inventors: Joon Sung Yang, Suwon-si (KR); Seung Yeob Lee, Anyang-si (KR)

(73) Assignee: Research and Business Foundation Sungkyunkwan University, Suwon-si (KR)

( * ) Notice: Subject to any disclaimer, the term of this patent is extended or adjusted under 35 U.S.C. 154(b) by 51 days.

(21) Appl. No.: 15/916,684

(22) Filed: Mar. 9, 2018

(65) Prior Publication Data
US 2018/0260275 A1 Sep. 13, 2018

(30) Foreign Application Priority Data

Mar. 9, 2017 (KR) .................. 10-2017-0030257
Mar. 9, 2017 (KR) .................. 10-2017-0030260

(51) Int. Cl.
*G06F 11/10* (2006.01)
*H03M 13/35* (2006.01)
(Continued)

(52) U.S. Cl.
CPC ...... *G06F 11/1068* (2013.01); *G06F 11/1048* (2013.01); *G11C 29/38* (2013.01);
(Continued)

(58) Field of Classification Search
CPC ............ G06F 11/1068; G06F 11/1048; H03M 13/353; H03M 13/356; G11C 29/38; G11C 29/52; G11C 2029/0411
See application file for complete search history.

(56) References Cited

U.S. PATENT DOCUMENTS

| | | | | |
|---|---|---|---|---|
| 2010/0128524 A1* | 5/2010 | Hadas | ................. | G11C 11/5628 365/185.03 |
| 2014/0029367 A1* | 1/2014 | Jung | ................ | G11C 29/50016 365/222 |
| 2014/0245108 A1* | 8/2014 | Gaertner | ............ | G06F 11/1048 714/773 |

FOREIGN PATENT DOCUMENTS

| | | |
|---|---|---|
| JP | 2007-157944 A | 6/2007 |
| JP | 2012-89137 A | 5/2012 |

(Continued)

*Primary Examiner* — April Y Blair
*Assistant Examiner* — Rong Tang
(74) *Attorney, Agent, or Firm* — NSIP Law

(57) ABSTRACT

A memory device having an error correction function includes: a memory element including multiple memory cells, a reconfiguration logic unit configured to group input data according to data retention properties of each memory cell in which each of the input data will be stored or group storage data stored in the memory element according to data retention properties of each memory cell in which each of the storage data is stored and arrange each of the input data or each of the storage data grouped by identical retention properties to be adjacent to each other, an error correction encoder configured to apply an error correction encoding algorithm with a different intensity to the grouped input data in each group, and an error correction decoder configured to apply an error correction decoding algorithm corresponding to an intensity applied by the error correction encoder to the grouped storage data in each group.

11 Claims, 21 Drawing Sheets

(51) Int. Cl.
*G11C 29/38* (2006.01)
*G11C 29/52* (2006.01)
*G11C 29/04* (2006.01)

(52) U.S. Cl.
CPC ....... *H03M 13/353* (2013.01); *H03M 13/356* (2013.01); *G11C 29/52* (2013.01); *G11C 2029/0411* (2013.01)

(56) References Cited

FOREIGN PATENT DOCUMENTS

| | | |
|---|---|---|
| KR | 10-2010-0075352 A | 7/2010 |
| KR | 10-1591694 B1 | 2/2016 |

\* cited by examiner

*FIG. 18*

| ADDRESS | SELECTION SIGNAL |
|---|---|
| 0 | 01100110 |
| 1 | 01010101 |
| 2 | 11001100 |
| ⋮ | ⋮ |
| N | 00010001 |

MEMORY DEVICE HAVING ERROR CORRECTION FUNCTION AND ERROR CORRECTION METHOD FOR MEMORY DEVICE

CROSS-REFERENCE TO RELATED APPLICATION

This application claims the benefit under 35 USC 119(a) of Korean Patent Application Nos. 10-2017-0030257 and 10-2017-0030260 filed on Mar. 9, 2017 in the Korean Intellectual Property Office, the entire disclosure of which is incorporated herein by reference for all purposes.

TECHNICAL FIELD

The present disclosure relates to a memory device and an error correction method for the memory device and more particularly, to a memory device having an error correction function, and an error correction encoding method and an error correction decoding method for the memory device.

BACKGROUND

An error correction code (ECC) refers to a function of inspecting whether an error occurs in data stored in a memory device and correcting an error if necessary. In general, the conventional ECC technology has protected all data stored in a memory device to the same level.

However, under normal conditions except extreme cases such as a satellite, data stored in the memory device are less likely to be lost due to external factors such as alpha-particle, radiation, temperature, and the like. Further, as the period of use of the memory device increases, the stability tends to decrease as compared with that immediately after manufacture.

That is, the stability of data stored in the memory device may depend on physical properties of memory cells included in the memory device. Further, the stability of data stored in the memory device may be affected by the period of use, the number of uses, and the environment of use of the memory device. Therefore, the conventional ECC that provides uniform intensity to all of cells included in the memory device may not be efficient.

In this regard, Korean Patent Laid-open Publication No. 10-2010-0075352 (entitled "Nonvolatile memory device and operating method thereof") discloses a technology of performing a copyback operation for moving data stored in a memory cell block to another memory cell block and then an invalid block process for preventing the memory cell block from being used if the number of error bits which are generated in each unit group within the memory cell during a read operation is equal to or smaller than the maximum allowable number of bits which can be corrected through an error checking and correction processing but greater than a set number of bits.

SUMMARY

In view of the foregoing, the present disclosure provides a memory device that changes an error correction intensity considering aging of memory cells included in the memory device and storing data therein and an error correction method for the memory device.

Further, the present disclosure provides a memory device having an error correction function based on data retention properties of memory cells and an error correction encoding method and an error correction decoding method using the same.

However, problems to be solved by the present disclosure are not limited to the above-described problems. There may be other problems to be solved by the present disclosure.

A first aspect of the present disclosure provides a memory device having an error correction function, including: a memory element including multiple memory cells; a reconfiguration logic unit configured to group input data which are input in a predetermined unit according to data retention properties of each memory cell in which each of the input data will be stored or group storage data of a predetermined unit stored in the memory element according to data retention properties of each memory cell in which each of the storage data is stored and arrange each of the input data or each of the storage data grouped by identical retention properties to be adjacent to each other; an error correction encoder configured to apply an error correction encoding algorithm with a different intensity to the grouped input data in each group; and an error correction decoder configured to apply an error correction decoding algorithm corresponding to an intensity applied by the error correction encoder to the grouped storage data in each group. Herein, a codeword produced for each group by the error correction encoder is matched with each of the input data and stored in the memory element, and an error correction process is performed according to a result of a comparison between a codeword produced for each group by the error correction decoder and the codeword for each group stored in the memory element.

A second aspect of the present disclosure provides an error correction encoding method for a memory device, including: grouping input data which are input in a predetermined unit according to data retention properties of each memory cell in which each of the input data will be stored or grouping storage data of a predetermined unit stored in a memory element according to data retention properties of each memory cell in which each of the storage data is stored, through a reconfiguration logic unit; producing a codeword by applying an error correction encoding algorithm with a different intensity to the grouped input data in each group through an error correction encoder; and matching the codeword produced for each group by the error correction encoder with the data and storing the codeword in the memory element. Herein, the memory element includes multiple memory cells, and the reconfiguration logic unit arranges each of the data grouped by identical retention properties to be adjacent to each other.

A third aspect of the present disclosure provides an error correction decoding method for a memory device, including: regrouping storage data of a predetermined unit stored in a memory element according to data retention properties of each memory cell in which each of the storage data is stored, through a reconfiguration logic unit; producing a codeword by applying an error correction decoding algorithm corresponding to an intensity applied by an error correction encoder to the regrouped storage data in each group, through an error correction decoder; comparing a codeword produced for each group with a codeword for each group matched with the storage data and stored in the memory element, through the error correction decoder; and performing an error correction process through the error correction decoder according to a result of the comparison. Herein, the memory element includes multiple memory cells, and the reconfiguration logic unit arranges each of the data grouped by identical retention properties to be adjacent to each other.

A fourth aspect of the present disclosure provides a memory device having an error correction function, including: a memory element including multiple memory cells; a controller configured to determine an error correction intensity for data stored or to be stored in each of the memory cells depending on an aging state of each of the memory cells; an error correction encoder configured to apply an error correction encoding algorithm corresponding to the determined error correction intensity for each of the memory cells to the data to be stored in each of the memory cells; and an error correction decoder configured to apply an error correction decoding algorithm corresponding to the determined error correction intensity to the data stored in each of the memory cells. Herein, the controller changes the error correction intensity determined corresponding to the memory cell on the basis of an aging state of the memory cell and applies an error correction encoding algorithm corresponding to the changed error correction intensity to data stored in the memory cell through the error correction encoder.

A fifth aspect of the present disclosure provides an error correction method for a memory device, including: changing an error correction intensity determined corresponding to a memory cell on the basis of an aging state of the memory cell by a controller; and applying an error correction encoding algorithm corresponding to the changed error correction intensity to data stored in the memory cell through an error correction encoder by the controller. Herein, the memory cell is included in a memory element including multiple memory cells, and the error correction intensity is determined by the controller for data stored or to be stored in the memory cell on the basis of the aging state of the memory cell.

According to any one of the embodiments of the present disclosure, it is possible to regulate an error correction intensity to be applied to data stored in each memory cell within a memory element on the basis of the degree of aging of the memory cell. That is, it is possible to efficiently manage data stored in a memory device considering physical properties depending on a process variation during the manufacture of the memory device.

Further, according to any one of the embodiments of the present disclosure, the error correction intensity is regulated considering the environment of use and the period of use. Therefore, it is possible to improve the stability of the memory device.

Furthermore, according to any one of the embodiments of the present disclosure, an error correction function can be set differently for each memory cell within the memory device depending on data retention properties of the memory cell. Therefore, it is possible to increase the stability of data stored in memory cells.

Moreover, according to any one of the embodiments of the present disclosure, a powerful error correction function is applied around a memory cell which is highly likely to be lost within the memory device. Therefore, it is possible to reduce unnecessary overhead.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 18 is an example diagram of a selection signal table in accordance with various embodiments described herein.

DETAILED DESCRIPTION

Figure 1:
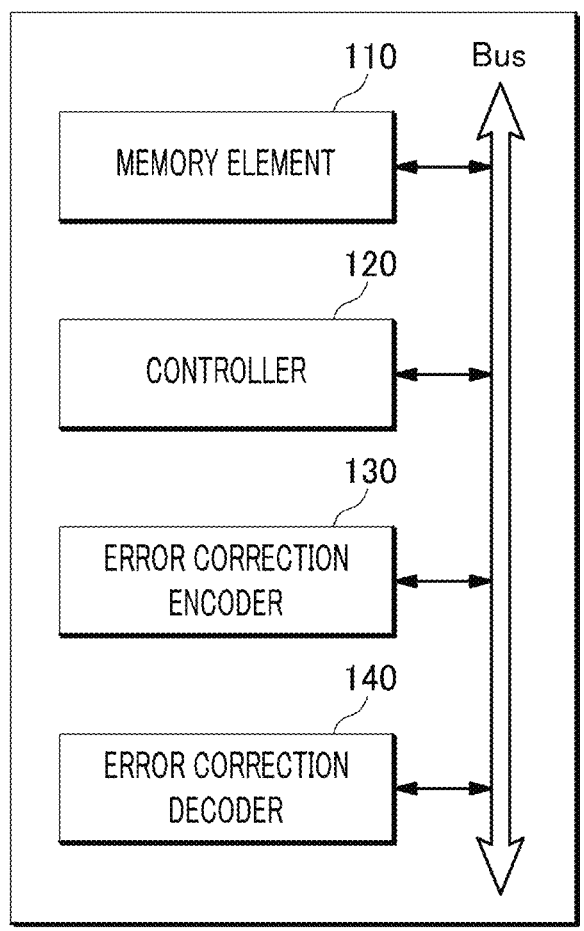
FIG. 1 is a block diagram of a memory device in accordance with various embodiments described herein.

Hereinafter, embodiments of the present disclosure will be described in detail with reference to the accompanying drawings so that the present disclosure may be readily implemented by a person with ordinary skill in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements unless context dictates otherwise.

The following embodiments are provided only for understanding of the present disclosure but not intended to limit the right scope of the present disclosure. Therefore, the inventions that perform the same functions in the same scope as the present disclosure are also included in the right scope of the present disclosure.

Hereinafter, a memory device 100 in accordance with an embodiment of the present disclosure will be described with reference to FIG. 1 to FIG. 5.

FIG. 1 is a block diagram of a memory device in accordance with an embodiment of the present disclosure.

The memory device 100 illustrated in FIG. 1 performs correction on the basis of an error correction code if data stored in a memory cell within a memory element 110 have an error or the data are lost. Herein, the memory device 100 includes the memory element 110, a controller 120, an error correction encoder 130, and an error correction decoder 140.

The memory element 110 may be non-volatile memory such as flash memory or volatile memory such as dynamic random access memory (DRAM). Further, the memory element 110 may be a three-dimensional memory, but may not be limited thereto.

The memory element 110 includes multiple memory cells. Herein, the memory cell may refer to a minimum unit for storing data.

In this case, each memory cell may have different physical properties due to an effect of a process variation during the manufacture of the memory element 110. The physical properties of a memory cell may be based on the possibility that some or all of data stored in a certain memory cell may have an error or may be lost. Further, the physical properties of a memory cell may be changed on the basis of operating conditions such as the temperature of a place where the memory device 110 is located and a voltage, external stimuli such as an impact, and aging.

The controller 120 may manage the data stored in the memory cell. Further, the controller 120 may distinguish whether or not the data stored in the memory cell have an error through the error correction encoder 130 and the error correction decoder 140, and if an error occurs, the controller 120 may correct the error.

The error correction encoder 130 applies an error correction encoding algorithm on the basis of an error correction intensity set for the data stored in the memory cell.

The error correction decoder 140 applies an error correction decoding algorithm set for the data stored in the memory cell to determine whether the data have an error.

Then, if the data to which the error correction decoding algorithm is applied are corrupted or lost, the error correction decoder 140 applies an error correction decoding algorithm with a preset error correction intensity to correct the corrupted data or recover the lost data.

Herein, the error correction intensity used in the error correction encoder 130 and the error correction decoder 140 may be one of multiple error correction intensities. Further, the error correction encoder 130 and the error correction decoder 140 may apply an error correction encoding algorithm or an error correction decoding algorithm depending on a set error correction intensity. Otherwise, the error correction encoder 130 and the error correction decoder 140 may selectively apply an error correction encoding algorithm or an error correction decoding algorithm depending on a set error correction intensity.

The error correction intensity is set for each of the multiple memory cells included in the memory element 110. Herein, the error correction intensities for the respective memory cells may be different from each other.

Hereinafter, the memory device 100 in accordance with an embodiment of the present disclosure will be described with reference to FIG. 2.

Figure 2:
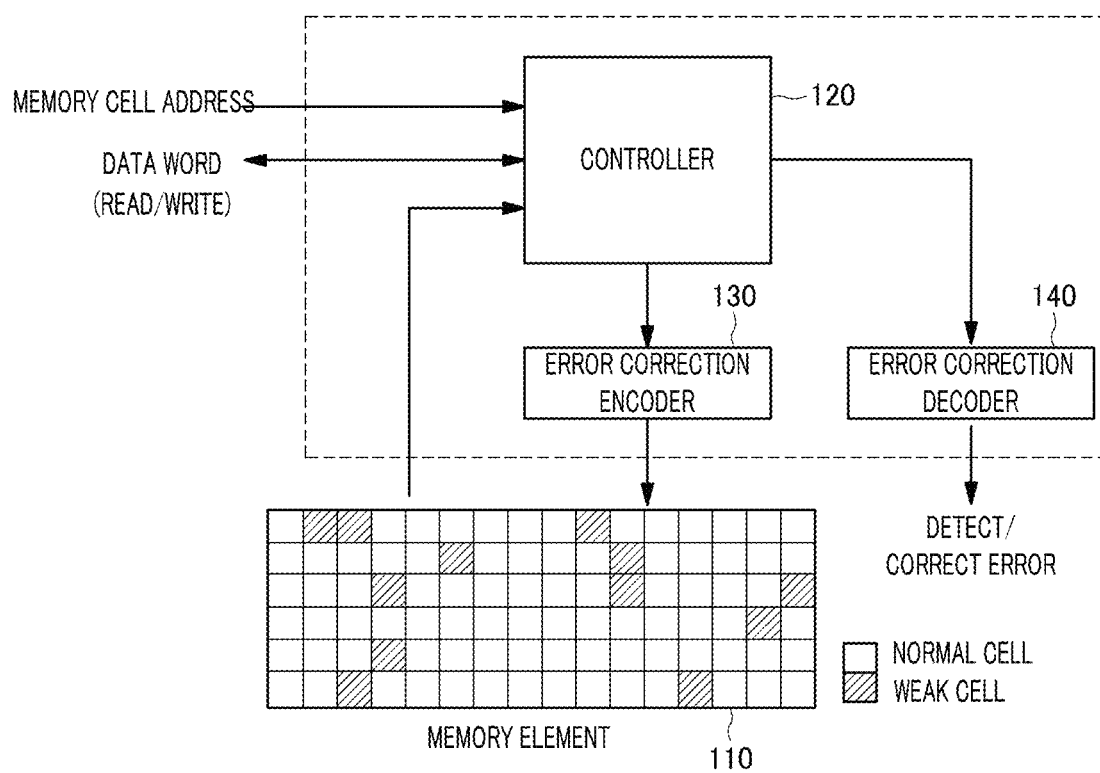
FIG. 2 is an example diagram of a memory device in accordance with various embodiments described herein.

FIG. 2 is an example diagram of the memory device 100 in accordance with an embodiment of the present disclosure.

If raw data of a predetermined unit to be stored in the memory element 110 are input, the memory device 100 may store the input raw data in one or more memory cells included in the memory element 110. Herein, the predetermined unit may refer to a word unit, but may not be limited thereto.

Further, the controller 120 may set an error correction intensity for the data. Herein, the error correction intensity may be divided into multiple intensities.

For example, the controller 120 may divide the error correction intensity into two intensities. In this case, a first intensity may be an error correction intensity to be applied to a weak cell having weak physical properties. Further, a second intensity may be an error correction intensity to be applied to a normal cell having normal physical properties.

Herein, the weak cell refers to a cell having low robustness. Further, the weak cell may be a cell having relatively weak physical properties or a cell which is aged by frequent occurrence of data storage and deletion. That is, data stored in the weak cell may be easily lost or corrupted as compared with those stored in the normal cell.

The normal cell, in contrast to the weak cell, has a lower possibility of data loss than the weak cell and thus can retain data stored therein for a long time.

Figure 3:
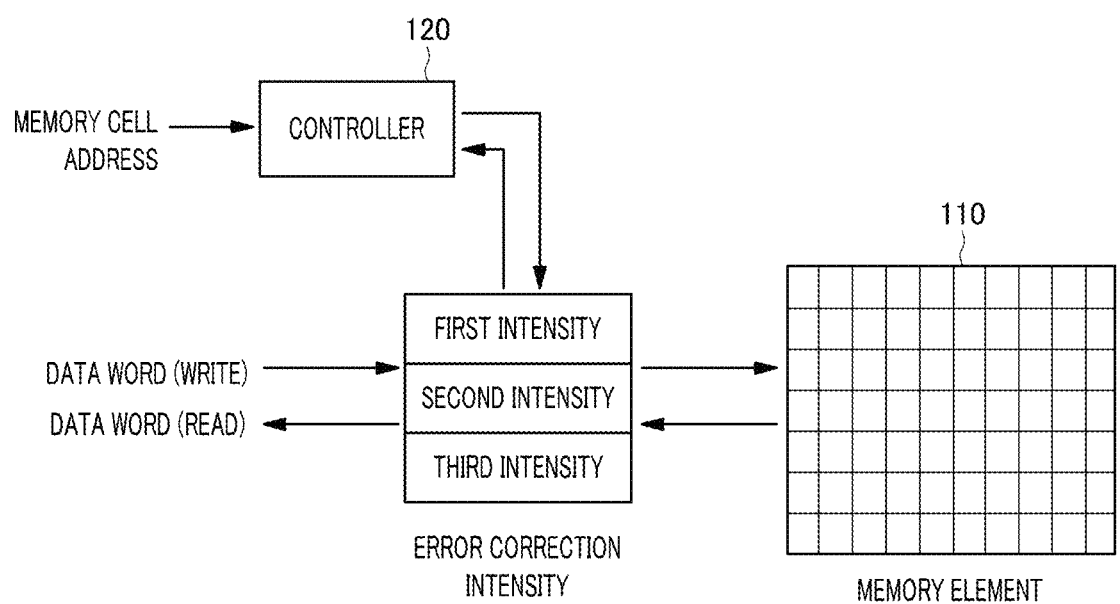
FIG. 3 is an example diagram of an error correction intensity in accordance with various embodiments described herein.

FIG. 3 is an example diagram of an error correction intensity in accordance with an embodiment of the present disclosure.

Referring to FIG. 3, the controller 120 may divide the error correction intensity into three intensities. In this case, a first intensity, a second intensity, and a third intensity may be different from one another.

For example, the first intensity may be an error correction intensity to be applied to a cell having the weakest physical properties. Further, the second intensity may be an error correction intensity to be applied to a cell having less weak physical properties than the cell corresponding to the first intensity, and the third intensity may be an error correction intensity to be applied to a normal cell. Therefore, the first intensity may be set to be higher than the second intensity and the third intensity. Further, the second intensity may be set to be higher than the third intensity. That is, the error correction intensities may satisfy a relationship of "first intensity>second intensity>third intensity".

The above-described error correction intensity is just an example, but the present disclosure may not be limited thereto. Therefore, the error correction intensity may be divided into multiple intensities depending on manufacturing and operating environments.

Meanwhile, if data are input, the controller 120 may store the data in a memory cell of the memory element 110 and set any one of multiple error correction intensities for the data.

For example, the controller 120 may apply a predetermined intensity of multiple intensities to the data. Otherwise, the controller 120 may set an error correction intensity for the data among the multiple intensities depending on physical properties of an area of the memory element 110 where the data are stored, but the present discloser may not be limited thereto.

If a memory cell where the data will be stored and an error correction intensity are set, the controller 120 may apply an error correction encoding algorithm to the data through the error correction encoder 130. In this case, the controller 120 may apply the error correction encoding algorithm on the basis of the error correction intensity set for the data.

Referring to FIG. 3 again, the error correction encoder 130 may apply the third intensity which is basically determined among the first intensity, the second intensity, and the third intensity to the data. Therefore, the error correction encoder 130 may produce error correction information about the data to which the third intensity is applied. Herein, the error correction information may be parity bits corresponding to the data, but may not be limited thereto.

The controller 120 may receive the error correction information corresponding to the data from the error correction encoder 130 and store the received error correction information in an error correction table. In this case, the controller 120 may match an address of the memory cell where the data are stored, the error correction intensity applied to the data, and the error correction information extracted from the data, and store them in the error correction table.

Meanwhile, if reading is performed to data stored in the memory element 110, the controller 120 may apply an error correction decoding algorithm to the data through the error correction decoder 140. To this end, the controller 120 may extract an error correction intensity and error correction information stored in the error correction table on the basis of an address of the data. Further, the controller 120 may transfer the extracted error correction intensity and error correction information to the error correction decoder 140.

The error correction decoder 140 may apply an error correction decoding algorithm corresponding to the error correction intensity received from the controller 120 to the data. Then, the error correction decoder 140 may produce error correction information corresponding to the data.

The error correction decoder 140 may compare the error correction information received from the controller 120 with the error correction information produced by the error correction decoder 140. Further, the error correction decoder 140 may determine whether or not the data have an error on the basis of whether or not the two pieces of error correction information agree with each other.

If the two pieces of error correction information do not agree with each other, the error correction decoder 140 may determine that an error is included in the data. Then, the error correction decoder 140 may correct the error in the data on the basis of the error correction information received from the controller 120 or the produced error correction information. For example, the error correction decoder 140 may recover the data on the basis of parity bits included in the error correction information received from the controller 120, or correct the error included in the data.

If the error in the data is corrected by the error correction decoder 140, the controller 120 may store an error correction history of the data in the memory element 110. For example, the controller 120 may store the error correction history in error correction information corresponding to the data stored in the error correction table or update a prestored error correction history. In this case, the error correction history may include the number of error corrections.

Meanwhile, in the memory element 110, aging of a specific memory cell may occur due to frequent uses, external environmental factors, external impacts, and the like. Further, the aged memory cell may be changed in physical properties as compared with a memory cell immediately after manufacture, and, thus, an error possibility may be increased.

Therefore, the controller 120 may perform a test of aging state to the memory cell of the memory element 110. Then, the controller 120 may change an error correction intensity set for the memory cell on the basis of a result of the test of aging state.

Further, the controller 120 may apply an error correction encoding algorithm corresponding to the changed error correction intensity to data stored or to be stored in the memory cell for which the error correction intensity is changed, through the error correction encoder 130.

Accordingly, the controller 120 can change an error correction intensity for data stored or to be stored in a memory cell with a high error possibility. Hereinafter, a process for changing an error correction intensity for data will be described in detail with reference to FIG. 4 and FIG. 5.

Figure 4:
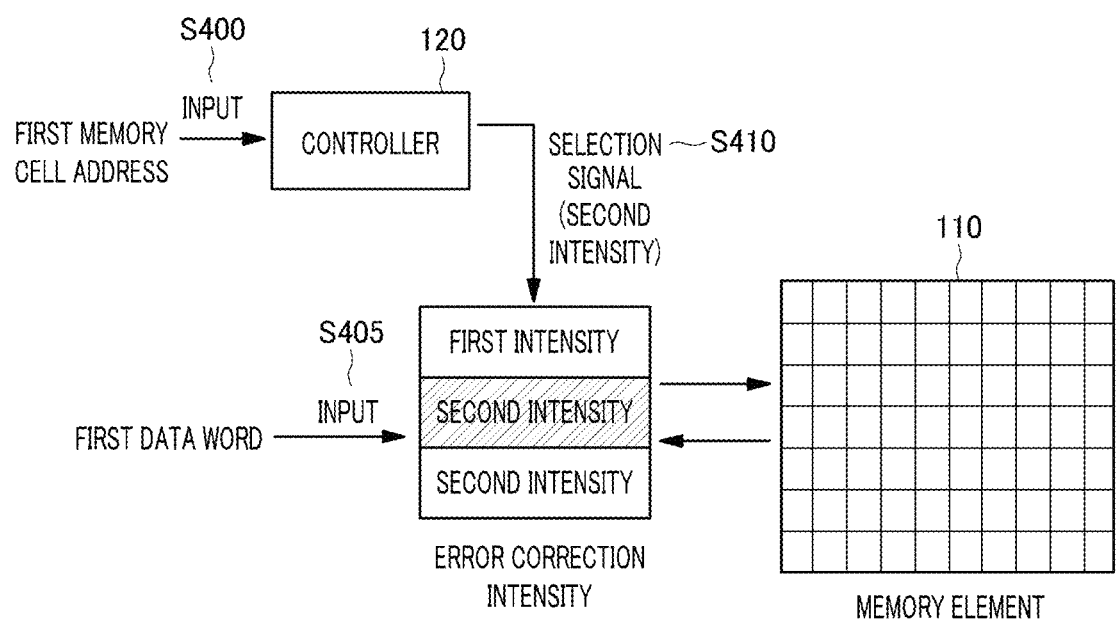
FIG. 4 is an example diagram of a process for setting an error correction intensity in accordance with various embodiments described herein.

FIG. 4 is an example diagram of a process for setting an error correction intensity in accordance with an embodiment of the present disclosure.

As described above, if first data to be stored in the memory element 110 are input, the controller 120 may store the first data in a first memory cell of the memory element 110 (S400 and S405). Then, the controller 120 may set an error correction intensity for the first memory cell where the first data are stored.

Herein, the error correction intensity may be divided into a first intensity, a second intensity, and a third intensity. It can be assumed that the first intensity is higher than the second intensity and the third intensity, and the second intensity is higher than the third intensity. That is, the error correction intensities may satisfy a relationship of "third intensity<second intensity<first intensity".

The controller 120 may select an error correction intensity corresponding to the first memory cell as the second intensity among the three intensities (S410).

The controller 120 may transfer a selection signal corresponding to an address of the first memory cell and the second intensity to the error correction encoder 130 (S410).

The error correction encoder 130 may apply an error correction encoding algorithm for the first data on the basis of the second intensity. Further, the error correction encoder 130 may transfer error correction information including parity bits produced through the error correction encoding algorithm to the controller 120.

Then, the controller 120 may match the address of the first memory cell where the first data are stored, the error correction information about the first data which is produced through the error correction encoding algorithm, and the second intensity set for the first data as an error correction intensity, and store them in the error correction table.

Figure 5:
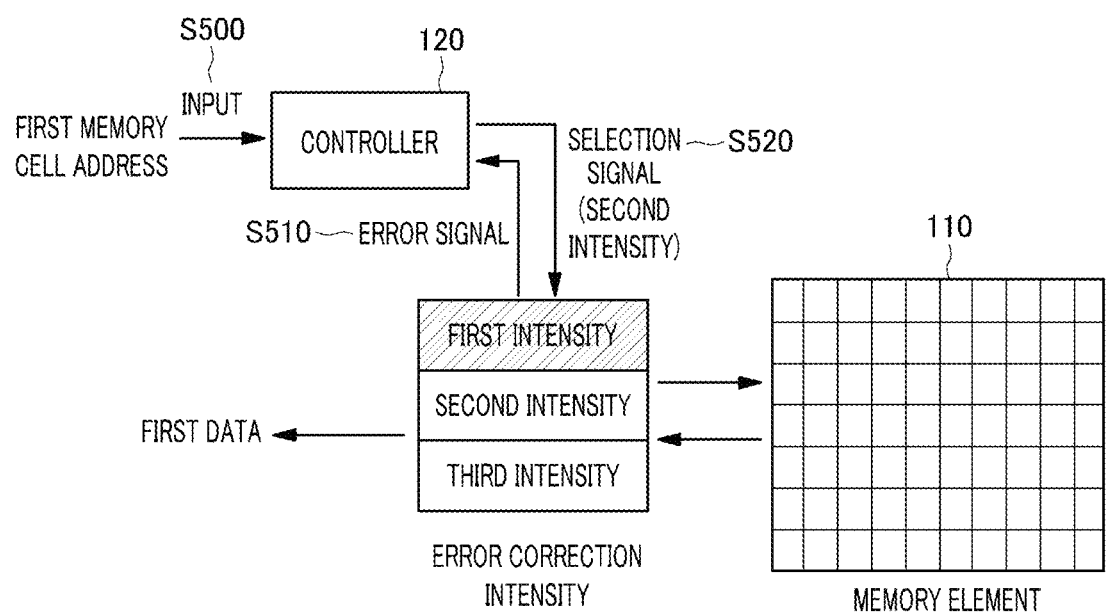
FIG. 5 is an example diagram of a process for changing an error correction intensity in accordance with various embodiments described herein.

FIG. 5 is an example diagram of a process for changing an error correction intensity in accordance with an embodiment of the present disclosure.

If reading of the first data stored in the memory element 110 is requested (S500), the controller 120 may extract the error correction intensity for the first data and the error correction information from the error correction table on the basis of the address of the first memory cell where the first data are stored.

The controller 120 may perform a test of an address to the first memory cell where the first data are stored.

In this case, the test may be based on an error correction history corresponding to the first memory cell. For example, the controller 120 may perform the test to the first memory cell on the basis of the error correction history corresponding to the first memory cell and stored in the error correction table. Further, the controller 120 may determine whether or not to change the error correction intensity for the first data according to predetermined conditions.

Herein, the predetermined conditions may include that the number of error corrections included in the error correction history is equal to or greater than a predetermined threshold value. Further, the predetermined conditions may include that the date of error occurrence included in the error correction history is within a predetermined date, but may not be limited thereto.

For example, if the number of error occurrences in the first memory cell is greater than a threshold value, the controller 120 may determine that physical properties of the first memory cell become weak. Therefore, the controller 120 may change the error correction intensity for the first data in order to apply error correction encoding and error correction decoding corresponding to an intensity higher than the second intensity currently set for the first data. That is, the controller 120 may change the error correction intensity corresponding to the first memory cell from the second intensity to the first intensity.

Further, the controller 120 may apply an error correction encoding algorithm corresponding to the changed first intensity to the first data through the error correction encoder 130. Furthermore, the controller 120 may reproduce error correction information corresponding to the first data through the error correction encoder 130.

The controller 120 may update the error correction intensity for the first data and the error correction information stored in the error correction table with the changed error correction intensity and the reproduced error correction information.

Further, if the controller 120 receives the request for reading of the first data or an error occurs in the first data, the controller 120 may apply an error correction decoding algorithm corresponding to the changed error correction intensity to the first data through the error correction decoder 140.

As such, the controller 120 may change or maintain an error correction intensity which is set when initial data are input, according to a result of the test.

Meanwhile, as described above, the test may be performed when reading of specific data is requested. Further, the test may be performed to all or some of data stored in the memory element 110 according to a predetermined cycle.

For example, the controller 120 may perform a test of aging state to memory cells corresponding to all data stored in the memory element 110 or some data selected by predetermined conditions according to a predetermined cycle. Then, the controller 120 may change a preset error correction intensity for data for which the error correction intensity needs to be changed, according to a result of the test.

The controller 120 may apply an error correction encoding algorithm corresponding to the changed error correction intensity for the data for which the preset error correction intensity is changed, through the error correction encoder 130. The controller 120 may update the error correction intensity for the data and the error correction information stored in the error correction table with the changed error correction intensity and error correction information produced by the error correction encoder 130.

Further, if an error correction intensity for specific data is changed, the controller 120 may change the error correction intensity to be higher than a preset error correction intensity.

For example, if the controller 120 determines to change the third intensity set for some data as an error correction intensity to a higher intensity according to a result of the test, the controller 120 may change the error correction intensity for the data to the second intensity or the first intensity which is higher than the third intensity.

Otherwise, if the number of error occurrences in specific data is smaller than a predetermined value or any error does not occur, the controller 120 may change a preset error correction intensity for the data to a lower error correction intensity.

For example, if the controller 120 determines to change the first intensity set for some data as an error correction intensity to a lower intensity according to a result of the test, the controller 120 may change the error correction intensity for the data to the second intensity or the third intensity which is lower than the first intensity.

Meanwhile, a memory device in accordance with another embodiment of the present disclosure may further include a BIST (built-in self-test) module for performing a self-test of aging state to a memory cell. Hereinafter, the memory device in accordance with another embodiment of the present disclosure will be described with reference to FIG. 6 and FIG. 7.

Figure 6:
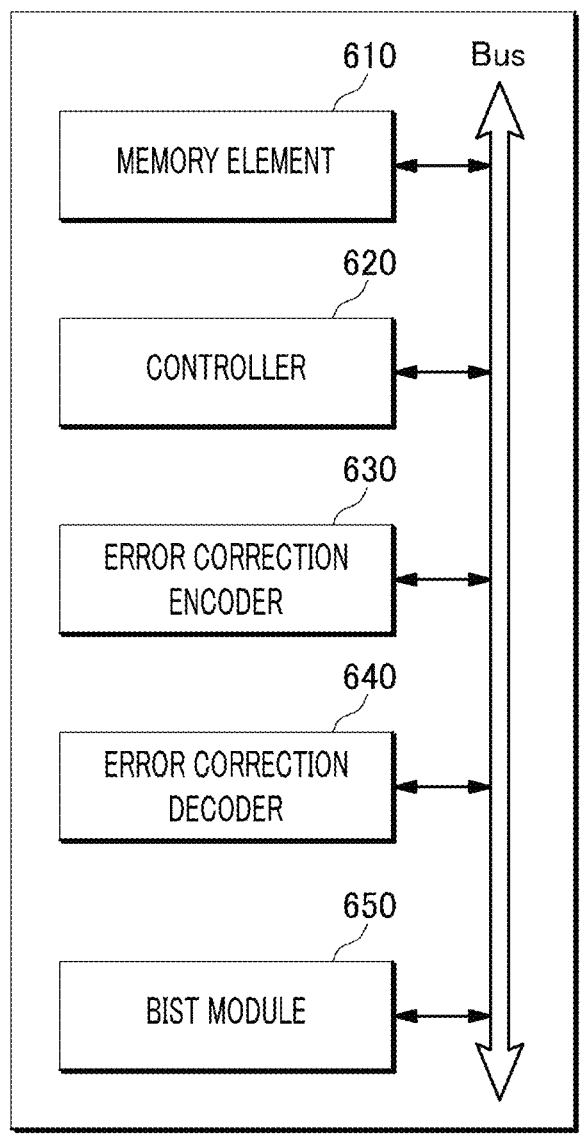
FIG. 6 is an example diagram of a memory device which further includes a BIST module in accordance with various embodiments described herein.

FIG. 6 is an example diagram of the memory device which further includes the BIST module in accordance with another embodiment of the present disclosure.

A memory element 610, a controller 620, an error correction encoder 630, and an error correction decoder 640 included in a memory device 600 illustrated in FIG. 6 can perform the same functions as the memory element 110, the controller 120, the error correction encoder 130, and the error correction decoder 140, respectively, included in the memory device 100 described above with reference to FIG. 1.

A BIST module 650 performs a test of aging state to multiple memory cells included in the memory element 610. Herein, the BIST module 650 may be included in the memory device 600 as illustrated in FIG. 6. Otherwise, the BIST module 650 may be implemented as hardware or software and connected to the memory device 600, but may not be limited thereto.

For example, the BIST module 650 may be implemented as software and installed in the form of system software or application for a computing device equipped with the memory element 610. Therefore, the BIST module 650 may be executed by an operating system of the computing device or a manager of the computing device.

Otherwise, the BIST module 650 may be hardware equipped with a circuit under test for performing a test of aging state within the memory element 610. Therefore, when the memory device 600 is powered on or the memory device 600 is reset, the BIST module 650 may perform a test of aging state or a test of error to memory cells included in the memory element 610.

Figure 7:
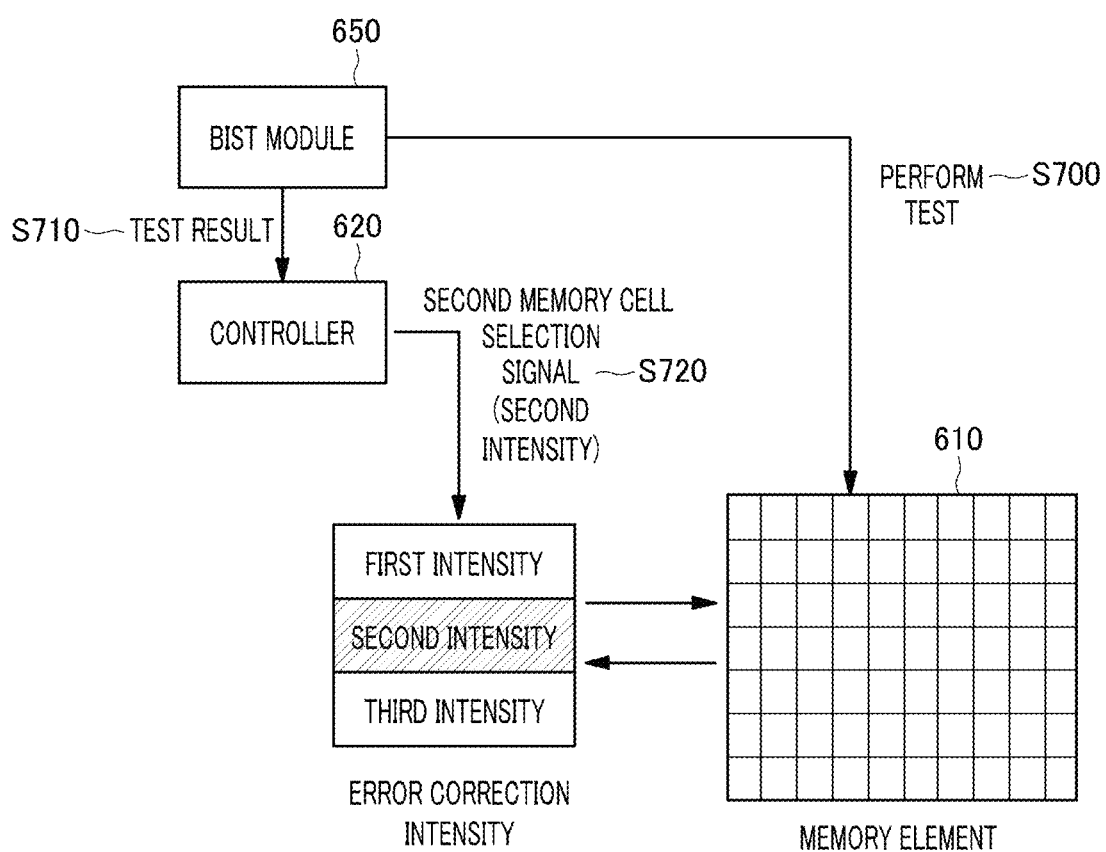
FIG. 7 is an example diagram a process for setting and changing an error correction intensity in accordance with various embodiments described herein.

FIG. 7 is an example diagram a process for setting and changing an error correction intensity in accordance with another embodiment of the present disclosure.

The BIST module 650 may perform a test of aging state to memory cells where one or more data are stored (S700). Further, the BIST module 650 may extract a memory cell having an error or a high error possibility from among the memory cells.

Referring to FIG. 7, the BIST module 650 may extract a second memory cell where second data are stored as a cell whose aging state is changed. Further, the BIST module 650 may transfer an address of the extracted second memory cell to the controller 120 (S710).

The controller 620 may transfer a selection signal corresponding to the second memory cell to the error correction encoder 630 to change an intensity of an error correction encoding algorithm for the second memory cell (S720).

The controller 620 may apply an error correction encoding algorithm corresponding to a second intensity to the data stored in the second memory cell through the error correction encoder 630. Further, the controller 620 may reproduce error correction information corresponding to the second data through the error correction encoder 630.

Furthermore, the controller 620 may update an error correction intensity for the second data and error correction information stored in an error correction table with a changed error correction intensity and the reproduced error correction information. That is, the controller 620 may change the error correction intensity corresponding to the second data and stored in the error correction table from the third intensity to the second intensity and then store the changed error correction intensity.

As such, the controller 620 may extract a memory cell having a high error possibility or an error from among memory cells where data are stored, through the BIST module 650. Further, the controller 620 may change an error correction intensity for the extracted memory cell.

Hereinafter, an error correction method for the memory device 100 in accordance with an embodiment of the present disclosure will be described with reference to FIG. 8.

Figure 8:
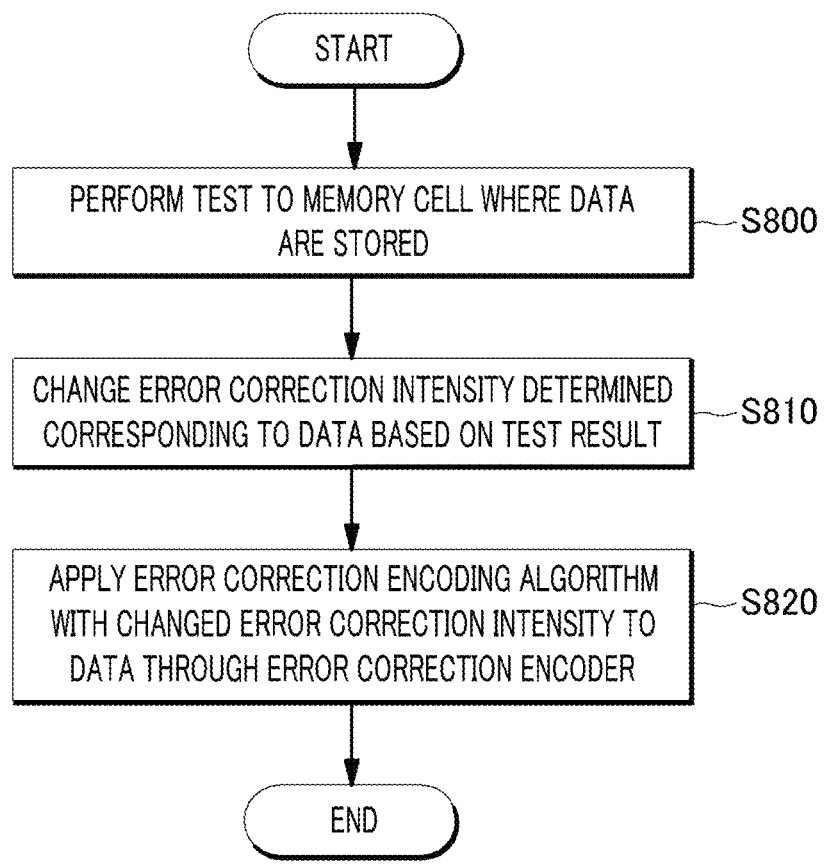
FIG. 8 is a flowchart provided to explain an error correction method for a memory device in accordance with various embodiments described herein.

FIG. 8 is a flowchart provided to explain an error correction method for a memory device in accordance with an embodiment of the present disclosure.

The controller 120 included in the memory device 100 changes an error correction intensity determined corresponding to a memory cell on the basis of an aging state of the memory cell (S800).

In this case, the memory device 100 includes the memory element 110 including multiple memory cells.

Further, the aging state may be determined by the controller 120 on the basis of the number of error occurrences in the memory cell. In this case, the number of error occurrences may be obtained by the error correction decoder.

For reference, the aging state may also be determined by the BIST module 650 described above with reference to FIG. 6 and FIG. 7. For example, the controller 120 may determine an aging state of a memory cell through the BIST module 650.

The error correction intensity may be determined by the controller 120 for data stored or to be stored in the memory cell on the basis of the aging state of the memory cell.

The controller 120 applies an error correction encoding algorithm corresponding to the changed error correction intensity to data through the error correction encoder 130 (S810).

Further, the controller 120 may apply an error correction decoding algorithm corresponding to the changed error correction intensity to data stored in the memory cell through the error correction decoder 140.

As such, the memory device 100 and the error correction method for the memory device 100 in accordance with an embodiment of the present disclosure can regulate an error correction intensity to be applied to data stored in a memory cell on the basis of an aging state of each memory cell in the memory element 110. Therefore, the memory device 100 and the error correction method for the memory device 100 can efficiently manage data stored in the memory device 100 considering physical properties depending on a process variation during the manufacture of the memory device 100. Further, the memory device 100 and the error correction method for the memory device 100 can regulate an error correction intensity considering the environment of use and the period of use, and, thus, it is possible to improve the stability of the memory device 100.

Hereinafter, a memory device having an error correction function in accordance with yet another embodiment of the present disclosure will be described with reference to FIG. 9 to FIG. 19B.

Figure 9:
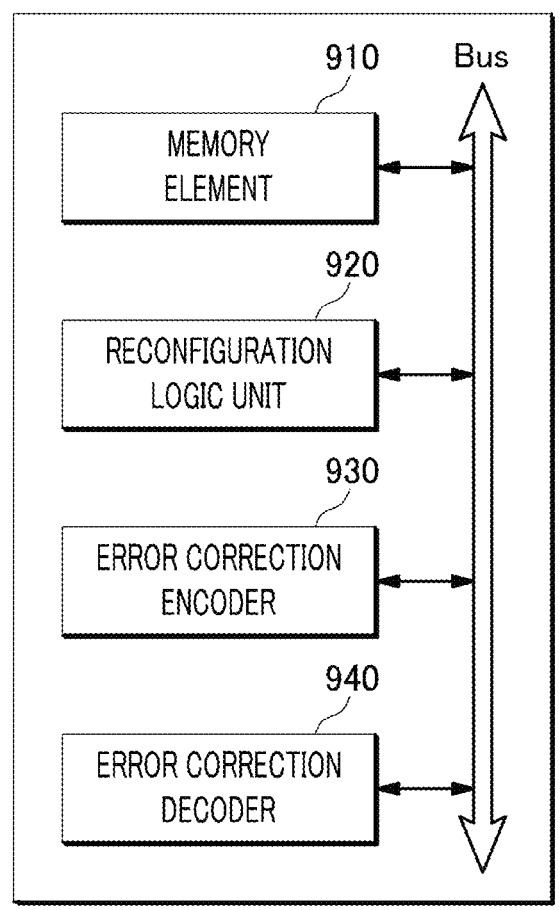
FIG. 9 is a block diagram of a memory device having an error correction function in accordance with various embodiments described herein.

FIG. 9 is a block diagram of a memory device having an error correction function in accordance with yet another embodiment of the present disclosure.

A memory device 900 illustrated in FIG. 9 performs correction on the basis of data retention properties of a memory cell within a memory element 910 if data stored in the memory cell have an error or the data are lost. Herein, the memory device 900 includes the memory element 910, a reconfiguration logic unit 920, an error correction encoder 930, and an error correction decoder 940.

The memory element 910 may be non-volatile memory such as flash memory or volatile memory such as dynamic random access memory (DRAM), but may not be limited thereto.

The memory element 910 may include multiple memory cells. Herein, the memory cell may refer to a minimum unit for storing data.

Further, each memory cell may have different cell retention properties due to an effect of a process variation during the manufacture of the memory element 910. The cell retention properties of a memory cell may be based on the possibility that some or all of data stored in a certain memory cell may have an error or may be lost. For example, the cell retention properties of a memory cell may be based on robustness of data stored in the memory cell to external stimuli and ambient operating conditions such as a temperature, a voltage, and aging.

The reconfiguration logic unit 920 groups input data or storage data according to retention properties of a memory cell where the input data or storage data are stored. Further, the reconfiguration logic unit 920 may arrange the input data or storage data according to grouping of the input data or storage data.

The error correction encoder 930 applies an error correction encoding algorithm with a different intensity to the grouped data in each group. That is, the error correction encoder 930 may produce a codeword for each of multiple groups included in the input data or storage data according to the error correction encoding algorithm. In this case, the codeword produced for each group may be matched with the input data or storage data and stored in the memory element 910.

The error correction decoder 940 applies an error correction decoding algorithm corresponding to an intensity applied by the error correction encoder 930 to each group of data stored in the memory element 910. Further, the error correction decoder 940 may distinguish whether or not the data have an error and perform error correction by using the error correction decoding algorithm.

Figure 10:
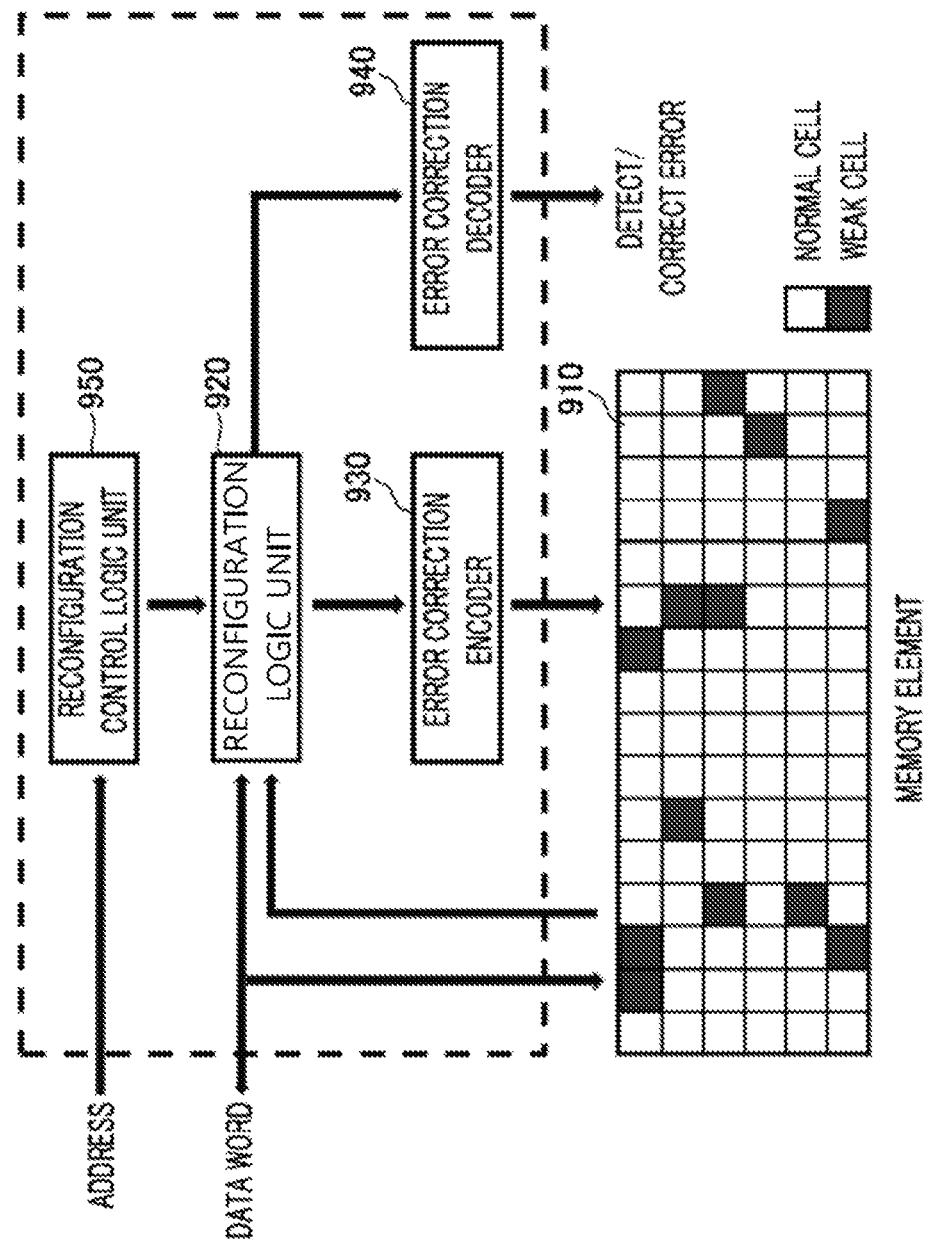
FIG. 10 is an example diagram of a memory device in accordance with various embodiments described herein.

As illustrated in FIG. 10, the memory device 900 may further include a reconfiguration control logic unit 950. Herein, the reconfiguration control logic unit 950 may store an address of the input data or storage data matched by the reconfiguration logic unit 920 within the memory element 910 and a selection signal. Herein, the selection signal may refer to a rearrangement state of data matched with the address within the memory element 910.

Hereinafter, the error correction function of the memory device 900 will be described in detail with reference to FIG. 10 to FIG. 13.

FIG. 10 is an example diagram of a memory device in accordance with still another embodiment of the present disclosure.

If data of a predetermined unit to be stored in the memory element 910 are input, the memory device 900 may store the input data in a predetermined area of a memory cell. Then, the memory device 900 may transfer the input data and an address of the memory element 910 where the input data will be stored to the reconfiguration logic unit 920.

Otherwise, the memory device 900 may transfer data of a predetermined unit stored in the memory device 900 and an address of the data to the reconfiguration logic unit 920.

Herein, the data of a predetermined unit transferred to the reconfiguration logic unit 920 may be referred to as a raw data word.

Figure 11:
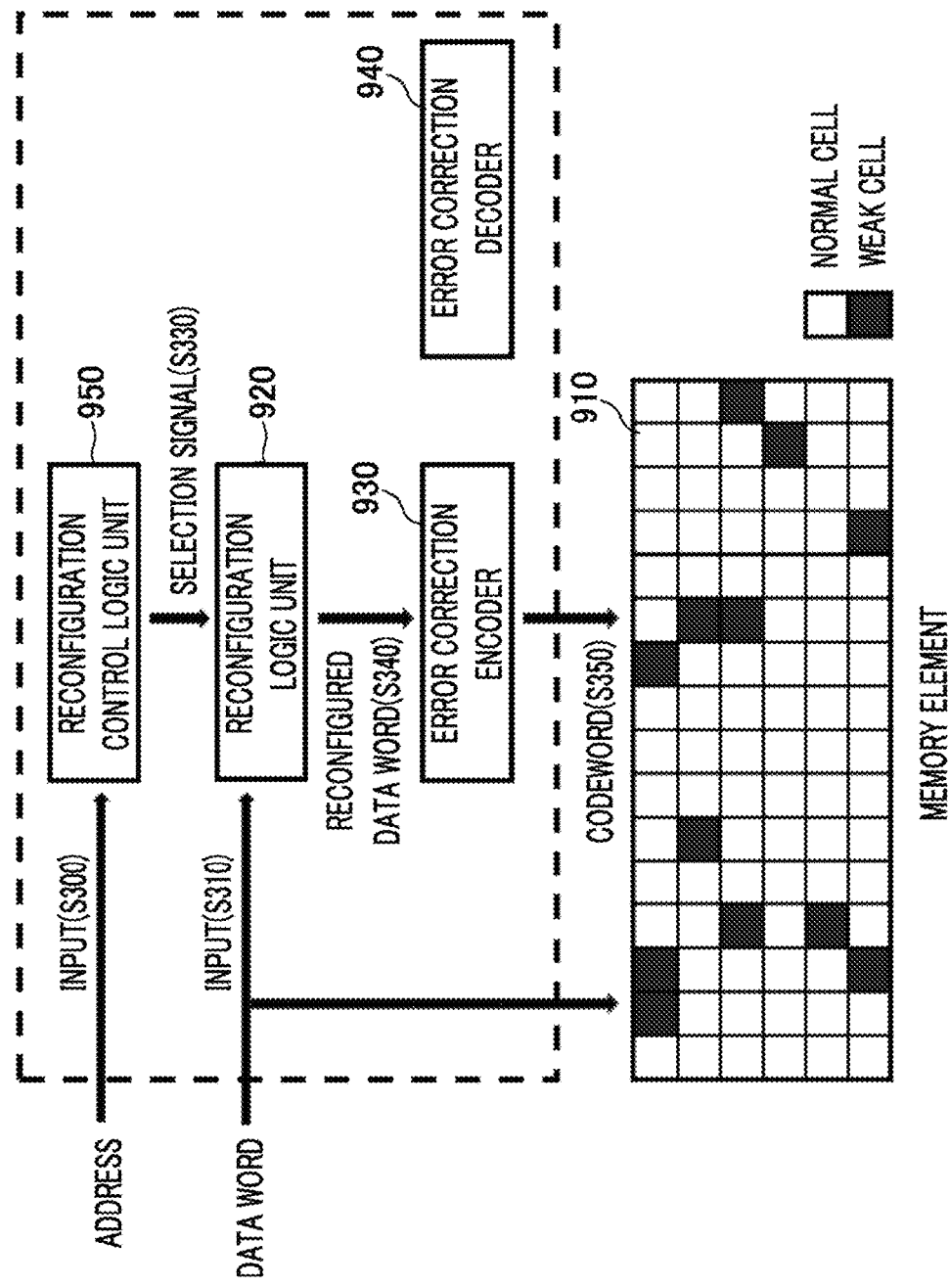
FIG. 11 is an example diagram provided to explain a method for applying an error correction encoding algorithm in accordance with various embodiments described herein.

FIG. 11 is an example diagram provided to explain a method for applying an error correction encoding algorithm in accordance with still another embodiment of the present disclosure. Further, FIG. 12 is an example diagram illustrating the reconfiguration of a data word including two groups in accordance with still another embodiment of the present disclosure.

As described above, each of the multiple memory cells included in the memory element 910 may have different data retention properties. Therefore, the memory device 900 may divide a raw data word into multiple groups according to data retention properties of a predetermined area where the raw data word is stored.

Figure 12:
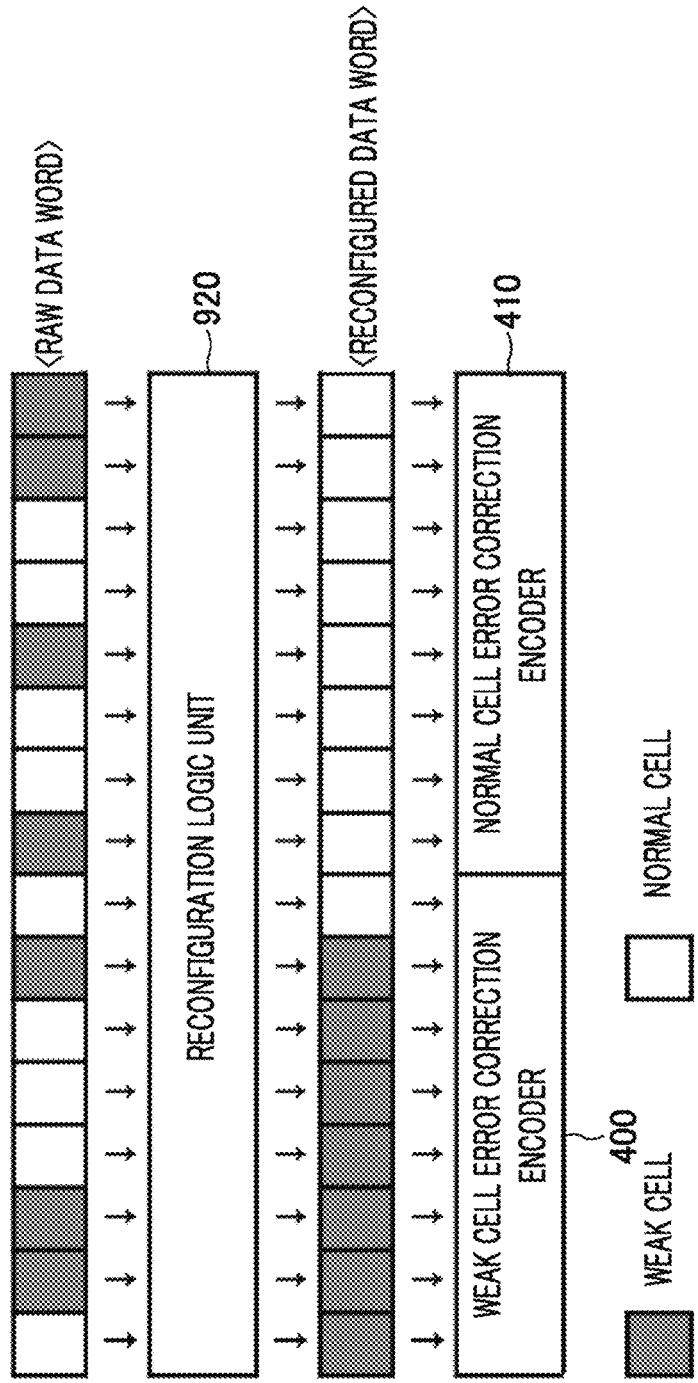
FIG. 12 is an example diagram illustrating the reconfiguration of a data word including two groups in accordance with various embodiments described herein.

For example, referring to FIG. 12, the memory device 900 may divide the predetermined area where the raw data word is stored into two groups. That is, if data retention properties of a memory cell are equal to or smaller than a first threshold value, the memory device 900 may classify the memory cell as a first group. Further, if the data retention properties are greater than the first threshold value, the memory device 900 may classify the memory cell as a second group.

Referring to FIG. 11, the first group may be a weak cell having weak data retention properties. Further, the second group may be a normal cell having normal data retention properties. The weak cell refers to a cell having low robustness. That is, data stored in the weak cell may be easily lost or corrupted by stimuli and ambient operating conditions. Further, the normal cell, in contrast to the weak cell, can retain data stored therein for a long time.

Meanwhile, the memory device 900 may divide memory cells into two or more groups depending on the degree of weakness according to data retention properties. In this case, the memory device 900 may divide the memory cells into two or more groups using two or more threshold values according to the degree of weakness.

For example, if data retention properties of a memory cell are equal to or smaller than a first threshold value, the memory device 900 may classify the memory cell as a first group. If the data retention properties are greater than the first threshold value and equal to or smaller than a second threshold value, the memory device 900 may classify the memory cell as a second group. If the data retention properties are greater than the second threshold value, the memory device 900 may classify the memory cell as a third group.

Herein, the error correction encoder 930 may apply an error correction encoding algorithm with a first intensity to data in the first group. Further, the error correction encoder 930 may apply an error correction encoding algorithm with a second intensity to data in the second group and an error correction encoding algorithm with a third intensity to data in the third group. The first intensity may be higher than the second intensity and the third intensity, and the third intensity may be lowest.

Meanwhile, this is just an example, and in some cases, the memory cells can be divided into more groups on the basis of more threshold values.

The memory device 900 may transmit a raw data word divided into multiple groups to the reconfiguration logic unit 920 (S300 and S310). In this case, the memory device 900 may transmit the raw data word to the reconfiguration logic unit 920 (S310), and transfer an address corresponding to the raw data word to the reconfiguration control logic unit 950 (S300).

For example, if there is an address corresponding to the raw data word in the reconfiguration control logic unit 950, the reconfiguration control logic unit 950 may select a selection signal matched with the address corresponding to the raw data word. Then, the reconfiguration control logic unit 950 may transfer the selection signal to the reconfiguration logic unit 920 (S330).

Then, the reconfiguration logic unit 920 that receives the selection signal from the reconfiguration control logic unit 950 may reconfigure the raw data word on the basis of the selection signal.

If there is no address or selection signal corresponding to the raw data word in the reconfiguration control logic unit 950, the reconfiguration logic unit 920 may reconfigure the raw data word.

In this case, the reconfiguration logic unit 920 may arrange memory cells with identical retention properties in the raw data word to be adjacent to each other. In this case, the reconfiguration logic unit 920 may arrange the raw data word on the basis of a MUX (multiplexer) circuit. The arrangement of the raw data word on the basis of the MUX circuit will be described later with reference to FIG. 17.

Referring to FIG. 12 again, input data included in the raw data word may be stored in a weak cell or a normal cell by a certain method. Therefore, the reconfiguration logic unit 920 may rearrange the raw data word stored in certain cells in which data in the same group are arranged adjacent to each other.

As such, if the raw data word is reconfigured by the reconfiguration logic unit 920, the reconfiguration logic unit 920 may transmit the reconfigured data word to the error correction encoder 930 (S340).

The error correction encoder 930 may produce a codeword using the reconfigured data word (S350). Herein, the codeword may be applied with an error encoding algorithm corresponding to an intensity for each group corresponding to the raw data word. Further, the codeword may include the raw data word and parity bits.

Specifically, the error correction encoder 930 may include multiple detailed error correction encoders to apply different error correction encoding algorithms to the respective groups.

Referring to FIG. 12, the error correction encoder 930 may include a weak cell error correction encoder 400 configured to correct an error in a weak cell and a normal cell error correction encoder 410 configured to correct an error in a normal cell. Herein, the weak cell error correction encoder 400 may be applied with an error correction encoding algorithm having a higher intensity as compared with the normal cell error correction encoder 410.

Further, the error correction encoder 930 may apply the weak cell error correction encoder 400 to data stored in a memory cell corresponding to the weak cell of the reconfigured data word. Furthermore, the error correction encoder 930 may apply the normal cell error correction encoder 410 to data stored in a memory cell corresponding to the normal cell of the reconfigured data word.

Figure 13:
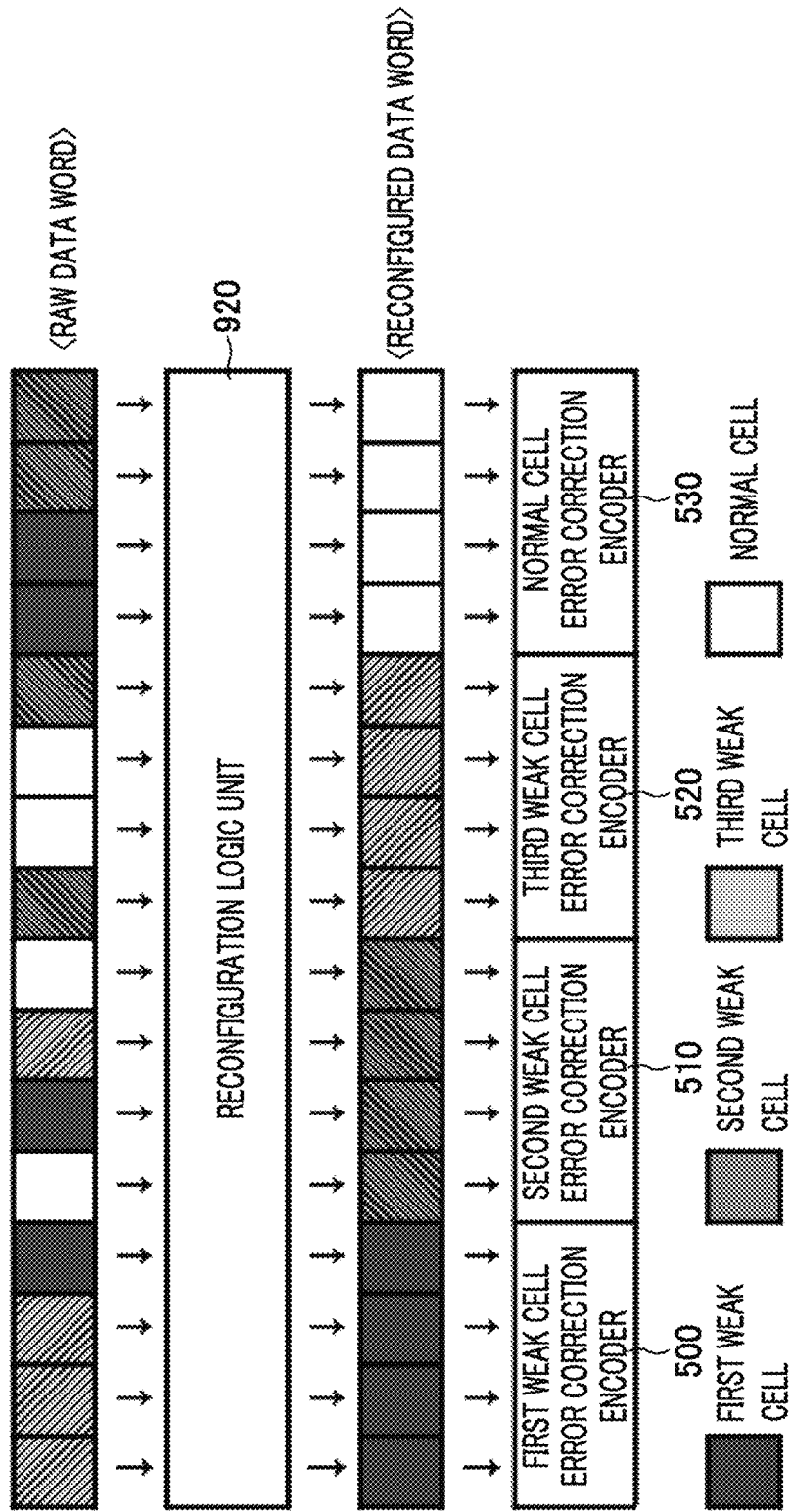
FIG. 13 is an example diagram illustrating the reconfiguration of a data word including four groups in accordance with various embodiments described herein.

FIG. 13 is an example diagram illustrating the reconfiguration of a data word including four groups in accordance with still another embodiment of the present disclosure.

As illustrated in FIG. 13, input data included in the raw data word may include four groups. Herein, the reconfiguration logic unit 920 may arrange data in the same group to be adjacent to each other according to an intensity for each group.

Further, the error correction encoder 930 may include a first weak cell error correction encoder 500, a second weak cell error correction encoder 510, a third weak cell error correction encoder 520, and a normal cell error correction encoder 530 as detailed error correction encoders. Therefore, each of the detailed error correction encoders can apply an error correction encoding algorithm with an intensity corresponding to each group.

Meanwhile, the memory device 900 in accordance with yet another embodiment of the present disclosure may apply the error correction function only to some predetermined groups among the multiple groups. In this case, the predetermined groups may be groups with a high error possibility.

For example, if the memory device 900 is located under conditions with a high possibility of data loss or corruption, such as a satellite, the memory device 900 may perform error correction to all of the groups.

Further, if the memory device 900 is located under normal conditions with a low possibility of data loss or corruption, the memory device 900 may perform error correction only to a group with a high possibility of data loss or corruption.

In this case, the error correction encoder 930 may apply an error correction encoding algorithm only to a weak cell having weak data retention properties.

Figure 14:
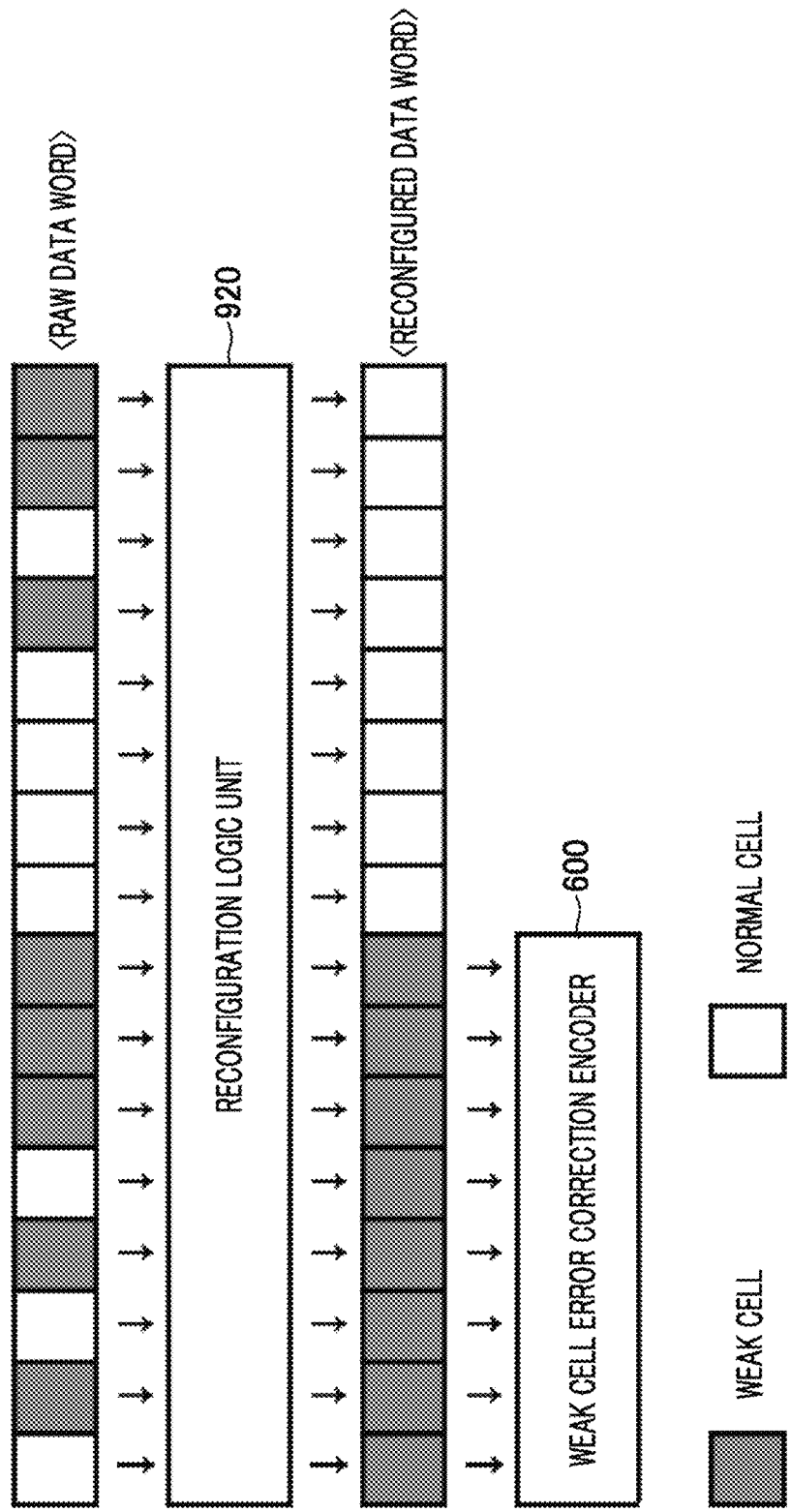
FIG. 14 is another example diagram illustrating the reconfiguration of a data word including two groups in accordance with various embodiments described herein.

FIG. 14 is another example diagram illustrating the reconfiguration of a data word including two groups in accordance with still another embodiment of the present disclosure.

Figure 15:
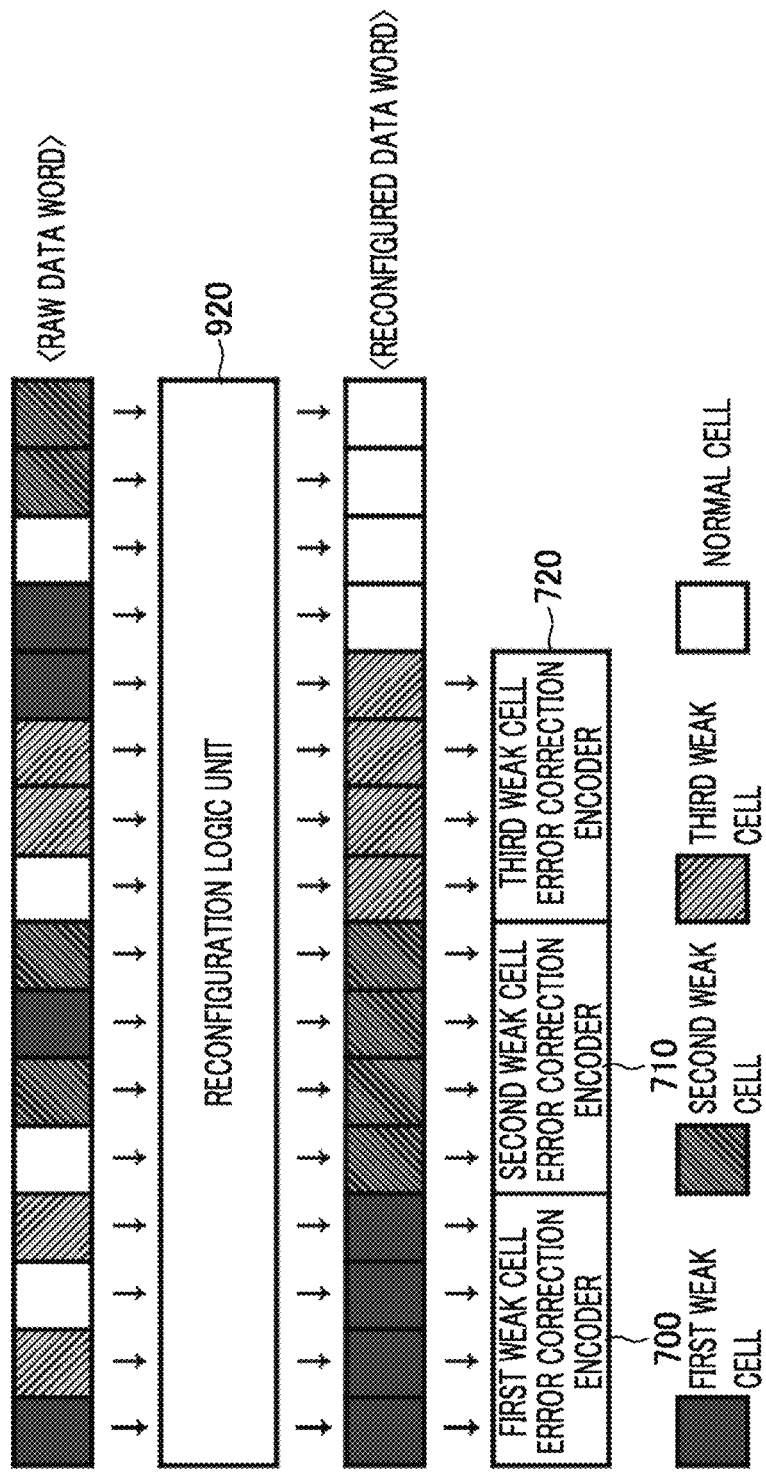
FIG. 15 is another example diagram illustrating the reconfiguration of a data word including four groups in accordance with various embodiments described herein.

Further, FIG. 15 is another example diagram illustrating the reconfiguration of a data word including four groups in accordance with an embodiment of the present disclosure.

Referring to FIG. 14, the error correction encoder 930 may include a weak cell error correction encoder 600 as a detailed error correction encoder. That is, the error correction encoder 930 may apply an error correction encoding algorithm only to a weak cell to generate a codeword.

Further, referring to FIG. 15, the error correction encoder 930 may include a first weak cell error correction encoder 700, a second weak cell error correction encoder 710, and a third weak cell error correction encoder 720 for first to third weak cells, respectively, except normal cells as detailed error correction encoders. Further, the respective detailed error correction encoders may apply error correction encoding algorithms suitable for the first weak cell, the second weak cell, and the third weak cell, respectively, except the normal cells to generate codewords.

As such, the error correction encoder 930 may produce a codeword for data corresponding to all or some of the multiple groups. Further, the error correction encoder 930 may store the codeword produced corresponding to the data in the memory element 910.

Meanwhile, the memory device 900 may apply an error correction decoding algorithm to data stored in the memory element 910 through the error correction decoder 940.

In this case, the error correction decoder 940 may apply an error correction decoding algorithm corresponding to an intensity applied by the error correction encoder 930 to each group of the record data.

Figure 16:
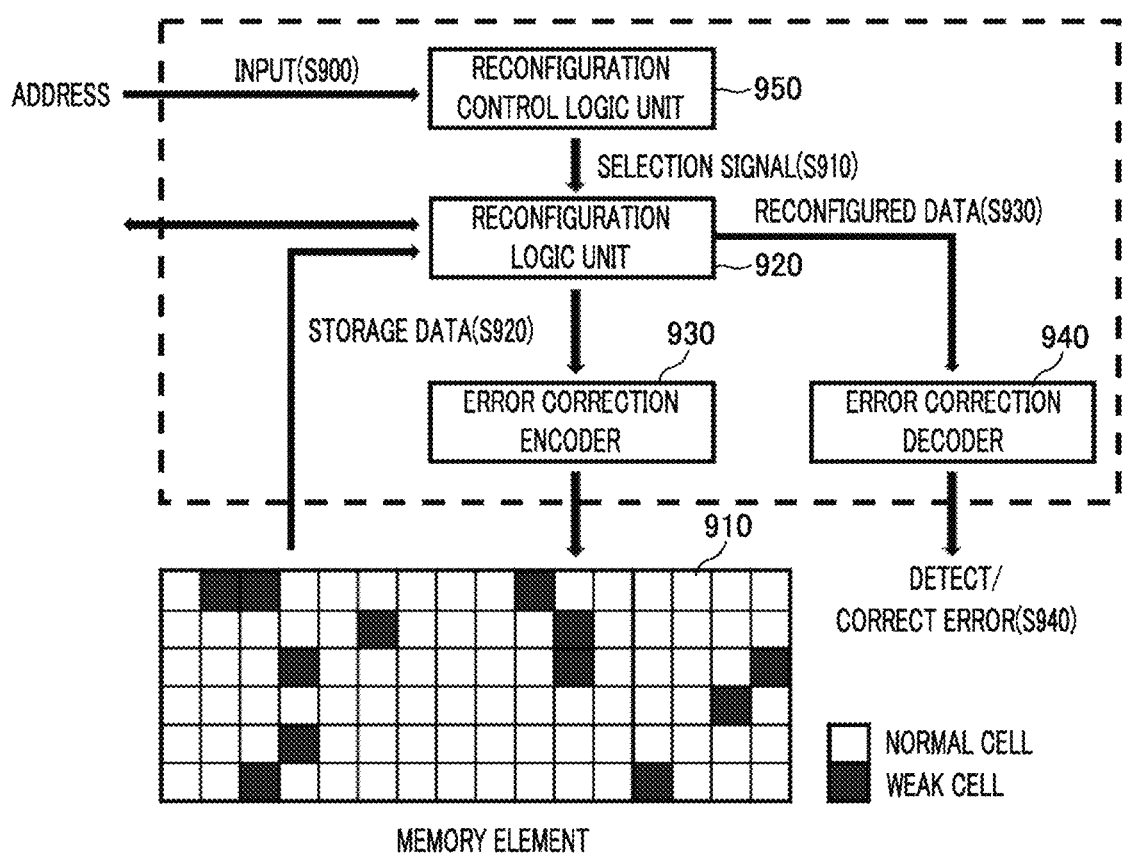
FIG. 16 is an example diagram provided to explain a method for applying an error correction decoding algorithm in accordance with various embodiments described herein.

FIG. 16 is an example diagram provided to explain a method for applying an error correction decoding algorithm in accordance with still another embodiment of the present disclosure.

Referring to FIG. 16, the memory device 900 may transfer record data stored in the memory element 910 to the reconfiguration logic unit 920 (S920). Then, the memory device 900 may transfer an address corresponding to the record data to the reconfiguration control logic unit 950 (S900).

The reconfiguration control logic unit 950 may select a selection signal matched with the address corresponding to the record data. Then, the reconfiguration control logic unit 950 may transfer the selected signal to the reconfiguration logic unit 920 (S910).

The reconfiguration logic unit 920 may reconfigure the record data on the basis of the record data and the selection signal. Further, the reconfiguration logic unit 920 may transfer the reconfigured record data to the error correction decoder 940 (S930).

The error correction decoder 940 may apply an error correction decoding algorithm corresponding to an intensity applied by the error correction encoder 930 to each group corresponding to the record data to the record data reconfigured by the reconfiguration logic unit 920.

Specifically, the error correction decoder 940 may produce a codeword for each group corresponding to record data. Further, the error correction decoder 940 may compare a codeword for record data which is produced using the error correction encoder 930 and stored in the memory element 910 with a codeword produced through the error correction decoder 940. Then, according to a result of the comparison, the error correction decoder 940 may detect an error included in the record data and if any error is detected, the error correction decoder 940 may correct the error included in the record data on the basis of the codeword produced through the error correction encoder 930 (S940).

For example, if the codeword for the record data stored in the memory element 910 agrees with the codeword produced through the error correction decoder 940 according to a result of the comparison, the error correction decoder 940 does not perform error correction to the record data. However, if the codeword for the record data stored in the memory element 910 does not agree with the codeword produced through the error correction decoder 940, the error correction decoder 940 may perform error correction to the record data. In this case, the error correction decoder 940 may perform error correction to the record data on the basis of the codeword for the record data stored in the memory element 910.

Meanwhile, similar to the above-described error correction encoder 930, the error correction decoder 940 may include multiple detailed error correction decoders to apply different error correction decoding algorithms to the respective groups.

For example, the error correction decoder 940 may include a weak cell error correction decoder configured to correct an error in a weak cell and a normal cell error correction decoder configured to correct an error in a normal cell. Herein, the weak cell error correction decoder may be applied with an error correction decoding algorithm having a higher intensity as compared with the normal cell error correction decoder.

Figure 17:
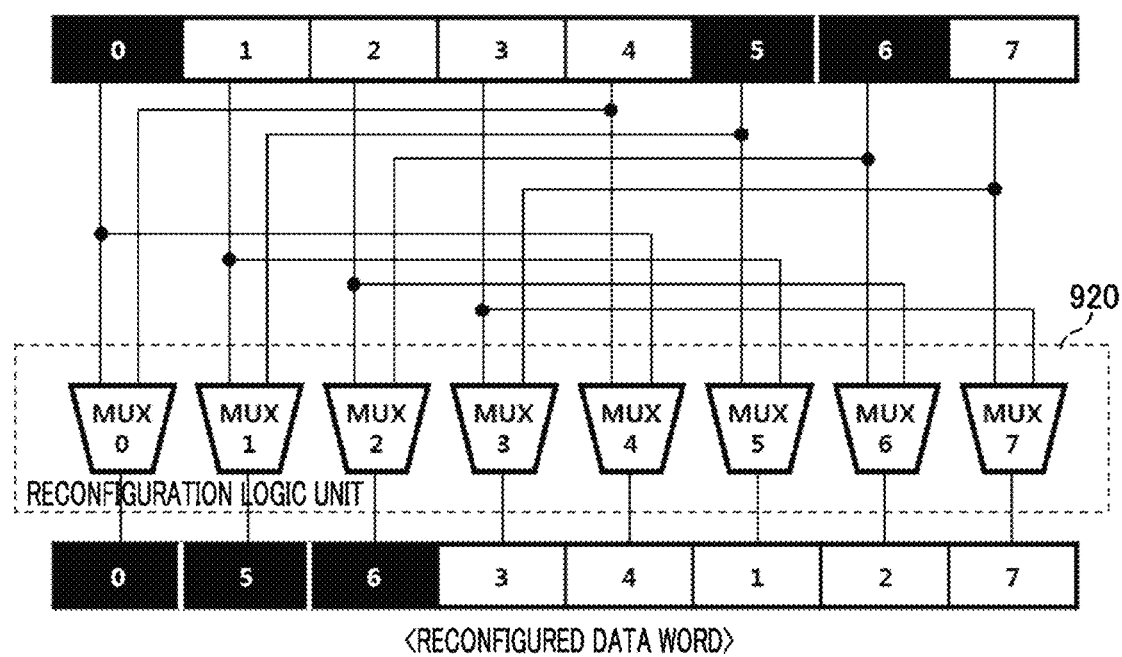
FIG. 17 is an example diagram illustrating the generation of a selection signal by a reconfiguration logic unit in accordance with various embodiments described herein.

FIG. 17 is an example diagram illustrating the generation of a selection signal by a reconfiguration logic unit in accordance with still another embodiment of the present disclosure.

Referring to FIG. 17, the reconfiguration logic unit 920 may include multiple MUX circuits arranged to change an address of input data according to a selection signal. Therefore, the reconfiguration logic unit 920 may arrange memory cells with identical cell retention properties to be adjacent to each other on the basis of the multiple MUX circuits.

Herein, the selection signal may be configured to change an operation state of each of the multiple MUX circuits to arrange memory cells with retention properties in the same group to be adjacent to each other on the basis of a result of a test of retention properties of each memory cell after the manufacture of the memory element 910. The selection signal will be described in detail with reference to FIG. 18.

FIG. 18 is an example diagram of a selection signal table in accordance with still another embodiment of the present disclosure.

The memory device 900 may match an address of data reconfigured by the reconfiguration logic unit 920 with a selection signal and store them in a selection signal table of the memory element 910. Therefore, the memory device 900 may select a selection signal corresponding to an address using the selection signal table as illustrated in FIG. 18.

Figures 19A, 19B:
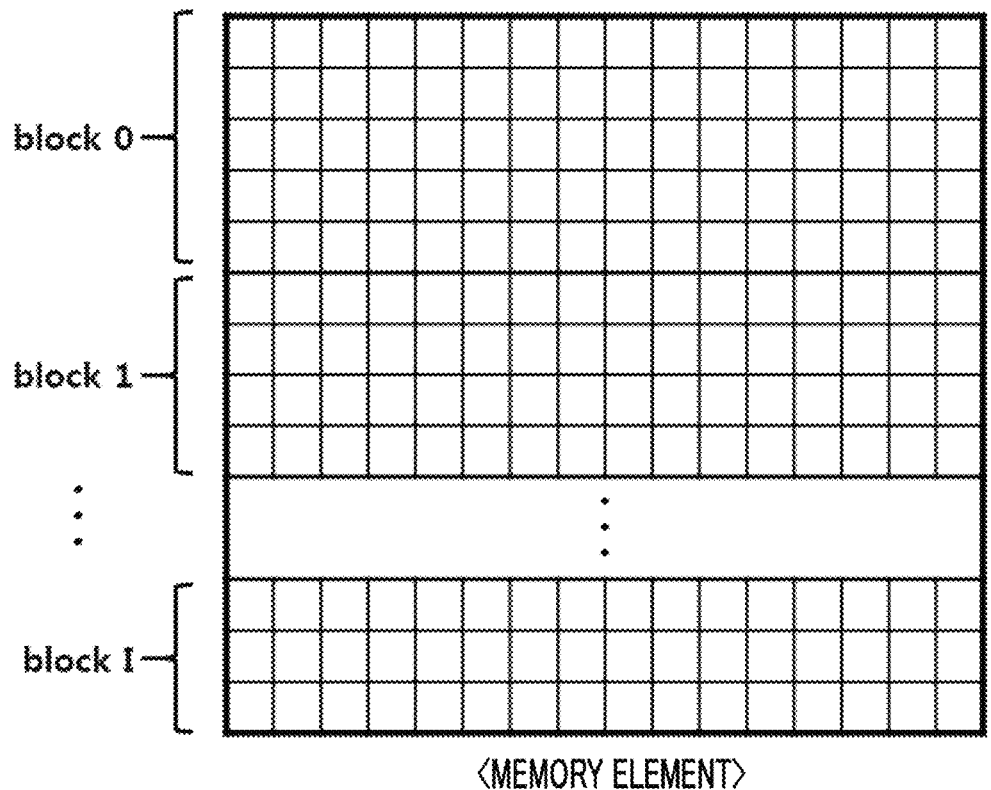
FIG. 19A is an example diagram provided to explain error correction in a block unit in accordance with various embodiments described herein.
FIG. 19B is an example diagram provided to explain error correction in a block unit in accordance with various embodiments described herein.

Each of FIG. 19A and FIG. 19B is an example diagram provided to explain error correction in a block unit in accordance with still another embodiment of the present disclosure.

As shown in FIG. 19A, a predetermined unit may be a block unit. Herein, the memory device 900 may group input data which are input in a block unit according to data retention properties. Further, the memory device 900 may apply an error correction encoding algorithm and an error correction decoding algorithm for each block unit.

Herein, as shown in FIG. 19B, a selection signal may be generated for each block unit. Further, the selection signal may be matched with each block unit and stored in the selection signal table for each block unit.

Hereinafter, an error correction encoding method for the memory device 900 in accordance with still another embodiment of the present disclosure will be described with reference to FIG. 20.

Figure 20:
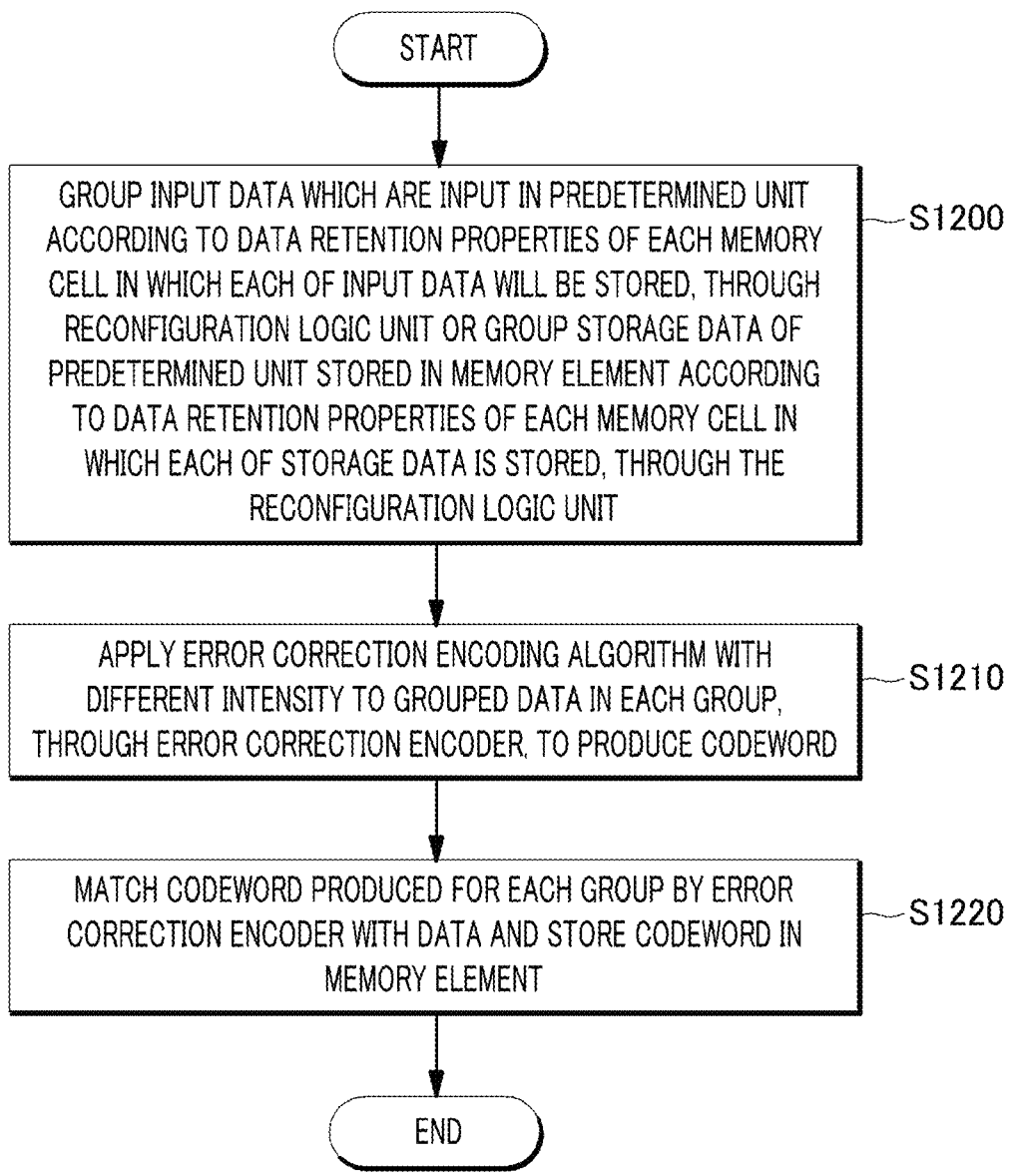
FIG. 20 is a flowchart provided to explain an error correction encoding method for a memory device in accordance with various embodiments described herein.

FIG. 20 is a flowchart provided to explain an error correction encoding method for a memory device in accordance with still another embodiment of the present disclosure.

The memory device 900 may group input data which are input in a predetermined unit according to data retention properties of each memory cell in which each of the input data will be stored, through the reconfiguration logic unit 920, or the memory device 900 may group storage data of a predetermined unit stored in the memory element 910 according to data retention properties of each memory cell in which each of the storage data is stored, through the reconfiguration logic unit 920 (S1200).

Herein, the reconfiguration unit 920 arranges the data grouped by identical retention properties to be adjacent to each other. Herein, the memory element 910 include multiple memory cells.

Then, the memory device 900 applies an error correction encoding algorithm with a different intensity to the grouped data in each group, through the error correction encoder 930, to produce a codeword (S1210).

Then, the memory device 900 matches the codeword produced for each group by the error correction encoder 930 with each of the data and stores the codeword in the memory element 910 (S1220).

For example, the reconfiguration unit 920 may divide the input data into a first group having data retention properties which are equal to or smaller than a first threshold value and a second group having data retention properties which are greater than the first threshold value. Therefore, the error correction encoder 930 may apply an error correction encoding algorithm having a higher intensity to the input data in the first group than to the input data in the second group. Further, the error correction decoder 940 may apply an error correction decoding algorithm corresponding to the intensity applied by the error correction encoder 930.

Otherwise, the reconfiguration unit 920 may divide the input data into a first group having data retention properties which are equal to or smaller than a first threshold value, a second group having data retention properties which are greater than the first threshold value and equal to or smaller than a second threshold value, and a third group having data retention properties which are greater than the second threshold value.

Therefore, the error correction encoder 930 may apply an error correction encoding algorithm having a first intensity to the input data in the first group. Further, the error correction encoder 930 may apply an error correction encoding algorithm having a second intensity to the input data in the second group and an error correction encoding algorithm having a third intensity to the input data in the third group. In this case, the first intensity may be the highest and the third intensity may be the lowest.

Hereinafter, an error correction decoding method for the memory device 900 in accordance with still another embodiment of the present disclosure will be described with reference to FIG. 21.

Figure 21:
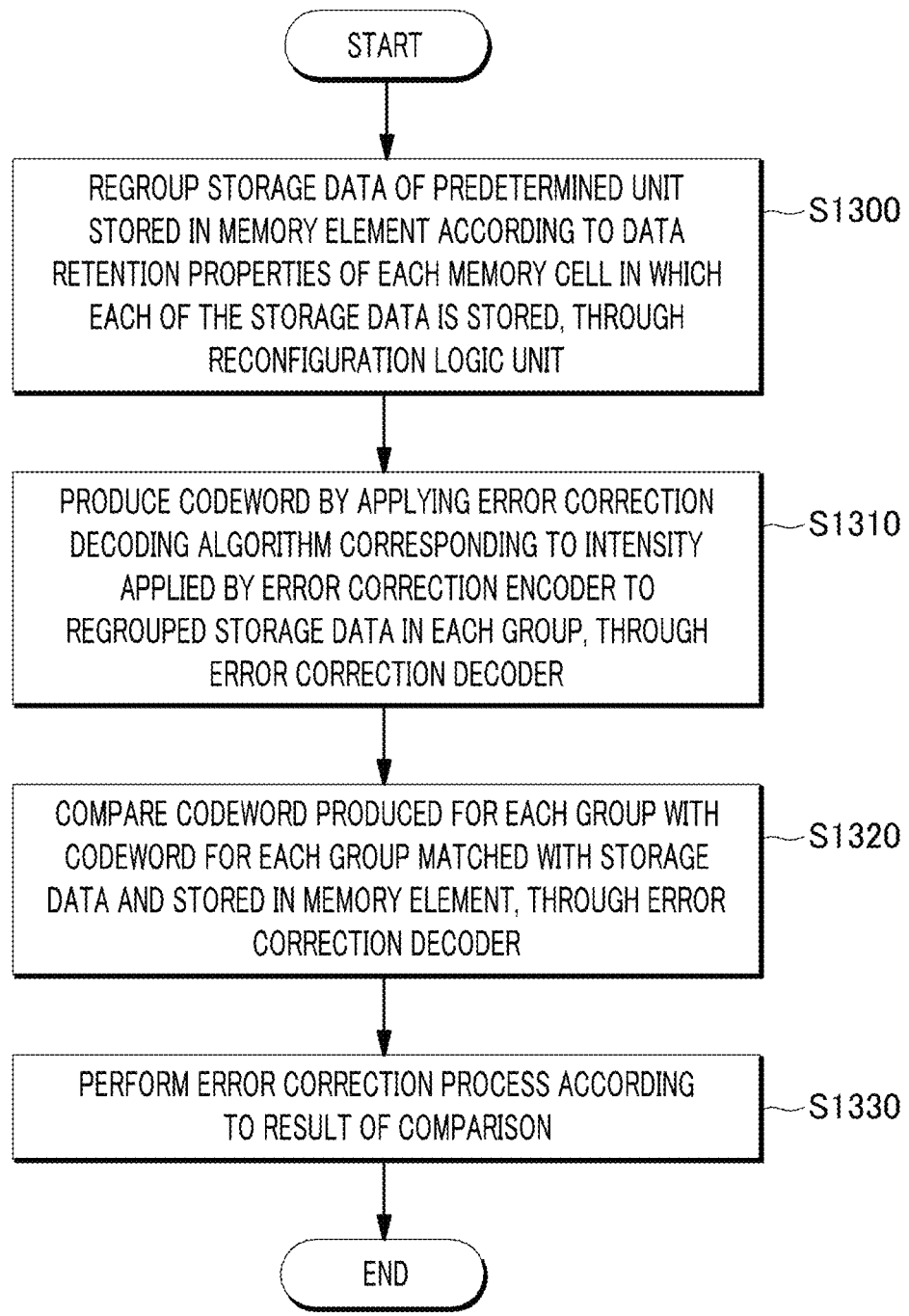
FIG. 21 is a flowchart provided to explain an error correction decoding method for a memory device in accordance with various embodiments described herein.

FIG. 21 is a flowchart provided to explain an error correction decoding method for a memory device in accordance with still another embodiment of the present disclosure.

The memory device 900 may regroup storage data of a predetermined unit stored in the memory element 910 according to data retention properties of each memory cell in which each of the storage data is stored, through the reconfiguration logic unit 920 (S1300).

Herein, the memory element 910 include multiple memory cells. Further, the reconfiguration unit 920 arranges the data grouped by identical retention properties to be adjacent to each other.

Then, the memory device 900 produces a codeword by applying an error correction decoding algorithm corresponding to an intensity applied by the error correction encoder 920 to the regrouped storage data in each group, through the error correction decoder 930 (S1310).

Then, the memory device 900 compares a codeword produced for each group with a codeword for each group matched with the storage data and stored in the memory element 910, through the error correction decoder 930 (S1320).

Then, the memory device 900 performs an error correction process through the error correction decoder 940 according to a result of the comparison (S1330).

As such, the memory device 900 having an error correction function, the error correction encoding method for the memory device 900, and the error correction decoding method for the memory device 900 in accordance with still another embodiment of the present disclosure can set an error correction function differently for each memory cell within the memory device 900 depending on data retention properties of each memory cell. Therefore, the memory device 900 having an error correction function, the error correction encoding method for the memory device 900, and the error correction decoding method for the memory device 900 can increase the stability of data stored in memory cells. Further, the memory device 900 having an error correction function, the error correction encoding method for the memory device 900, and the error correction decoding method for the memory device 900 can apply a powerful error correction function around a memory cell which is highly likely to be lost and thus can reduce unnecessary overhead.

Each of the error correction method for the memory device, the error correction encoding method for the memory device, and the error correction decoding method for the memory device in accordance with the above-described embodiments of the present disclosure can be embodied in a storage medium including instruction codes executable by a computer such as a program module executed by the computer. A computer-readable medium can be any usable medium which can be accessed by the computer and includes all volatile/non-volatile and removable/non-removable media. Further, the computer-readable medium may include all computer storage and communication media. The computer storage medium includes all volatile/non-volatile and removable/non-removable media embodied by a certain method or technology for storing information such as computer-readable instruction code, a data structure, a program module or other data. The communication medium typically includes the computer-readable instruction code, the data structure, the program module, or other data of a modulated data signal such as a carrier wave, or other transmission mechanism, and includes a certain information transmission medium.

Each of the error correction method for the memory device, the error correction encoding method for the memory device, and the error correction decoding method for the memory device in accordance with the embodiments of the present disclosure has been explained in relation to a specific embodiment, but their components or a part or all of their operations can be embodied by using a computer system having general-purpose hardware architecture.

The above description of the present disclosure is provided for the purpose of illustration, and it would be understood by a person with ordinary skill in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A memory device having an error correction function, comprising:
  a memory element including multiple memory cells;
  a reconfiguration logic unit configured to:
    group input data which are input in a predetermined unit according to data retention properties of each memory cell in which each of the input data will be stored, or
    group storage data of a predetermined unit stored in the memory element according to data retention properties of each memory cell in which each of the storage data is stored, and
    rearrange each of the input data or each of the storage data having identical data retention properties to be adjacent to each other based on a result of the grouping and on a result of a test of the data retention properties of each memory cell;
  an error correction encoder configured to apply an error correction encoding algorithm with a different intensity to the grouped input data in each group; and
  an error correction decoder configured to apply an error correction decoding algorithm corresponding to an intensity applied by the error correction encoder to the grouped storage data in each group,
  wherein:
  the reconfiguration logic unit comprises multiple multiplexer (MUX) circuits configured to change an address of each input data according to a selection signal stored in the memory element so as to arrange memory cells with identical data retention properties to be adjacent to each other based on the multiple MUX circuits, and
  the selection signal is configured to change an operation state of each MUX circuit to arrange memory cells with data retention properties in the same group to be adjacent to each other based on the result of the test of the data retention properties of each memory cell, and
  wherein a codeword produced for each group by the error correction encoder is matched with each of the input data and stored in the memory element, and an error correction process is performed according to a result of a comparison between the codeword produced for each group by the error correction decoder and the codeword for each group stored in the memory element.

2. The memory device of claim 1, wherein the input data which are input in the predetermined unit are stored in a predetermined area of the memory element before being input into the reconfiguration logic unit, and the codeword produced for each group by the error correction encoder is matched with the predetermined area and then stored.

3. The memory device of claim 1,
  wherein the test occurs after the manufacture of the memory element.

4. The memory device of claim 1, wherein the selection signal is matched with each of the input data and stored in a predetermined area of the memory element.

5. The memory device of claim 1, wherein the reconfiguration logic unit divides the input data into a first group having data retention properties which are equal to or smaller than a first threshold value and a second group having data retention properties which are greater than the first threshold value,
- wherein the error correction encoder applies the error correction encoding algorithm having a higher intensity to the input data in the first group than to the input data in the second group, and
- wherein the error correction decoder applies the error correction decoding algorithm corresponding to the intensity applied by the error correction encoder.

6. The memory device of claim 1, wherein the reconfiguration logic unit divides the input data into a first group having data retention properties which are equal to or smaller than a first threshold value, a second group having data retention properties which are greater than the first threshold value and equal to or smaller than a second threshold value, and a third group having data retention properties which are greater than the second threshold value,
- wherein the error correction encoder applies the error correction encoding algorithm having a first intensity to the input data in the first group, the error correction encoding algorithm having a second intensity to the input data in the second group, and the error correction encoding algorithm having a third intensity to the input data in the third group,
- wherein the first intensity is the highest and the third intensity is the lowest, and
- wherein the error correction decoder applies the error correction decoding algorithm corresponding to the intensity applied by the error correction encoder.

7. The memory device of claim 1, wherein the codeword includes the input data and parity bits corresponding to the input data.

8. An error correction encoding method for a memory device, the method comprising:
- grouping input data which are input in a predetermined unit according to data retention properties of each memory cell in which each of the input data will be stored, through a reconfiguration logic unit;
- producing a codeword by applying an error correction encoding algorithm with a different intensity to the grouped input data in each group through an error correction encoder; and
- matching the codeword produced for each group by the error correction encoder with the data and storing the codeword in a memory element,
- wherein the memory element includes multiple memory cells, and
- wherein:
- the reconfiguration logic unit comprises multiple multiplexer (MUX) circuits configured to change an address of each input data according to a selection signal stored in the memory element so as to arrange memory cells with identical data retention properties to be adjacent to each other based on the multiple MUX circuits, and
- the selection signal is configured to change an operation state of each MUX circuit to arrange memory cells with data retention properties in the same group to be adjacent to each other based on a result of a test of the data retention properties of each memory cell.

9. The error correction encoding method for a memory device of claim 8, wherein the reconfiguration logic unit divides the input data into a first group having data retention properties which are equal to or smaller than a first threshold value and a second group having data retention properties which are greater than the first threshold value, and
- wherein the error correction encoder applies an error correction encoding algorithm having a higher intensity to the input data in the first group than to the input data in the second group.

10. The error correction encoding method for a memory device of claim 8, wherein the reconfiguration logic unit divides the input data into a first group having data retention properties which are equal to or smaller than a first threshold value, a second group having data retention properties which are greater than the first threshold value and equal to or smaller than a second threshold value, and a third group having data retention properties which are greater than the second threshold value,
- wherein the error correction encoder applies an error correction encoding algorithm having a first intensity to the input data in the first group, an error correction encoding algorithm having a second intensity to the input data in the second group, and an error correction encoding algorithm having a third intensity to the input data in the third group, and
- wherein the first intensity is the highest and the third intensity is the lowest.

11. An error correction decoding method for a memory device, the method comprising:
- regrouping storage data of a predetermined unit stored in a memory element according to data retention properties of each memory cell in which each of the storage data is stored, through a reconfiguration logic unit;
- producing a codeword by applying an error correction decoding algorithm corresponding to an intensity applied by an error correction encoder to the regrouped storage data in each group, through an error correction decoder;
- comparing a codeword produced for each group with a codeword for each group matched with the storage data and stored in the memory element, through the error correction decoder; and
- performing an error correction process through the error correction decoder according to a result of the comparison,
- wherein:
- the memory element comprises multiple memory cells, and the reconfiguration logic unit comprises multiple multiplexer (MUX) circuits configured to change an address of each storage data according to a selection signal stored in the memory element so as to arrange memory cells with identical data retention properties to be adjacent to each other based on the multiple MUX circuits, and
- the selection signal is configured to change an operation state of each MUX circuit to arrange memory cells with data retention properties in the same group to be adjacent to each other based on a result of a test of the data retention properties of each memory cell.

* * * * *